US008531745B2

(12) United States Patent
Oki

(10) Patent No.: US 8,531,745 B2
(45) Date of Patent: Sep. 10, 2013

(54) IMAGE FORMATION DENSITY CORRECTION IN IMAGE FORMING APPARATUS

(75) Inventor: Makoto Oki, Moriya (JP)

(73) Assignee: Canon Kabushiki Kaisha (JP)

( * ) Notice: Subject to any disclaimer, the term of this patent is extended or adjusted under 35 U.S.C. 154(b) by 807 days.

(21) Appl. No.: 11/945,148

(22) Filed: Nov. 26, 2007

(65) Prior Publication Data

US 2008/0124115 A1 May 29, 2008

(30) Foreign Application Priority Data

Nov. 27, 2006 (JP) ................................. 2006-318655
Nov. 21, 2007 (JP) ................................. 2007-302129

(51) Int. Cl.
*G03F 3/08* (2006.01)

(52) U.S. Cl.
USPC ............. 358/521; 358/504; 358/518; 358/1.9

(58) Field of Classification Search
USPC .................... 358/1.9, 1.1, 501, 504, 518, 521
See application file for complete search history.

(56) References Cited

U.S. PATENT DOCUMENTS

| | | | | |
|---|---|---|---|---|
| 3,893,166 | A * | 7/1975 | Pugsley | 358/523 |
| 4,959,669 | A * | 9/1990 | Haneda et al. | 347/115 |
| 6,034,788 | A * | 3/2000 | Sasanuma et al. | 358/406 |
| 6,243,542 | B1 * | 6/2001 | Fujimoto et al. | 399/49 |
| 7,583,408 | B2 * | 9/2009 | Maeda et al. | 358/1.9 |
| 2003/0128381 | A1 * | 7/2003 | Zaima | 358/1.9 |
| 2004/0174404 | A1 | 9/2004 | Itagaki | |
| 2005/0089340 | A1 * | 4/2005 | Yamamoto | 399/49 |

FOREIGN PATENT DOCUMENTS

| | | | |
|---|---|---|---|
| JP | 09-037080 | A | 2/1997 |
| JP | 2000-238341 | A | 9/2000 |
| JP | 2001-309178 | A | 11/2001 |
| JP | 2002-118763 | A | 4/2002 |
| JP | 2004-185029 | A | 7/2004 |
| JP | 2004-264749 | A | 9/2004 |
| JP | 2006-287708 | A | 10/2006 |

OTHER PUBLICATIONS

Japanese Office Action issued in Japanese counterpart application No. JP2007-302129, dated Aug. 21, 2012.

* cited by examiner

*Primary Examiner* — King Poon
*Assistant Examiner* — Jamares Q Washington
(74) *Attorney, Agent, or Firm* — Rossi, Kimms & McDowell LLP

(57) ABSTRACT

An image processing apparatus which makes it possible to correct the image density of a target color in real time and maintain highly accurate image density characteristics over a long term. In a first control, the output of a laser driver is controlled such that the gradation of an image signal coincides with that of an image to be recorded on a sheet. The density level of a developed patch to be formed on a photosensitive drum is set to a different value on a toner color-by-toner color basis. In a second control, the output from the laser driver is controlled such that the density of the developed patch coincides with a reference density. An LUT generated in the first control is corrected according to the difference between the density of the developed patch and the reference density.

6 Claims, 33 Drawing Sheets

SPECTRAL CHARACTERISTICS OF YELLOW TONER REFLECTANCE

SPECTRAL CHARACTERISTICS OF MAGENTA TONER REFLECTANCE

SPECTRAL CHARACTERISTICS OF CYAN TONER REFLECTANCE

SPECTRAL CHARACTERISTICS OF BLACK TONER REFLECTANCE

IMAGE FORMATION DENSITY CORRECTION IN IMAGE FORMING APPARATUS

BACKGROUND OF THE INVENTION

1. Field of the Invention

The present invention relates to an image processing apparatus which is configured to transfer an image formed on an image carrier onto a recording medium, such as a sheet, to thereby form an image on the recording medium, and a control method therefor.

2. Description of the Related Art

Conventionally, the following methods are known which enable an image processing apparatus to maintain stability of image quality. One example is a method in which a gradation pattern or the like specific pattern is formed on a sheet, and then the gradation pattern information read by an image reader is supplied to image forming conditions including γ correction in a feedback manner to thereby enhance the stability of image quality. Further, long-term use of the image processing apparatus can cause a change in the adhesion characteristic of developing toners with respect to the potential on the photosensitive drum potential, which makes it difficult to obtain an optimum image quality only by the γ correction performed by the feedback of gradation pattern information thereto. To overcome this problem, a technique has been disclosed e.g. in Japanese Laid-Open Patent Publication No. 2000-238341, in which the stability of image quality is maintained by adjusting density correction characteristics according to the relationship between gradation pattern information read by the image reader and the densities of images (patches) formed on a photosensitive member in predetermined timing.

However, when the method proposed in Japanese Laid-Open Patent Publication No. 2000-238341 is employed, the γ correction is possible in a preset density range of patch levels, but in the other density ranges, the γ correction sometimes cannot provide sufficient effects. Further, in the conventional image processing apparatus, image density is stabilized mainly with respect to a range of process gray (gray generated by mixing three colors Y (yellow), M (magenta), and C (cyan)). For this reason, colors actually printed on a sheet cannot always have sufficient stability with respect to memory colors (sky blue, pale peach color, etc.) normally imaged by human beings.

SUMMARY OF THE INVENTION

The present invention provides an image processing apparatus and a control method therefor, which make it possible to correct the image densities of target colors in real time and maintain highly accurate image density characteristics over a long term.

In a first aspect of the present invention, there is provided an image processing apparatus that transfers an image formed on an image carrier by developing a latent image formed thereon by exposure using an exposure unit, onto a recording medium, comprising a first control unit configured to compare a result of reading of a gradation pattern formed on a recording medium based on an image signal with the image signal, and control an output from the exposure unit such that a gradation of the image signal coincides with a gradation of an image to be recorded on a recording medium, a density setting unit configured to set a density level of a patch image to be formed on the image carrier based on the output from the exposure unit controlled by the first control unit to a different value, on a developer color-by-developer color basis, a detecting unit configured to detect the density of the patch image formed on the image carrier based on the output from the exposure unit controlled by the first control unit, a second control unit configured to control the output from the exposure unit such that the density of the patch image detected by the detecting unit coincides with a reference density which is a density of the patch image formed on the image carrier based on the output from the exposure unit after control by the first control unit, and an image forming control unit configured to combine a first table associating the image signal with the output from the exposure unit and a correction table for use in correcting the image signal such that the density of the patch image detected by the detecting unit coincides with the reference density into a second table, and perform image formation using the second table.

With the configuration of the image forming apparatus according to the first aspect of the present invention, the first table for associating an image signal with the output from the exposure unit and the correction table for correcting the image signal such that the detected density of the patch image coincides with the reference density are combined into the second table, and image formation is performed using the second table. This makes it possible to correct the image densities of target colors in real time and maintain highly accurate image density characteristics over a long term.

The image carrier on which the patch image is formed can be selected from the group consisting of a photosensitive drum on which a latent image is formed by the exposure unit and which transfers an image formed by developing the latent image onto a recording medium, and an intermediate transfer member onto which the image formed on the photosensitive drum is transferred and which transfers the image onto a recording medium.

The values set by the density setting unit for the density level of the patch image can be changed on a developer color-by-developer color basis.

The image processing apparatus comprises a designation unit configured to be capable of designating a target color in an image of an original or a displayed image as desired.

When a density level of the designated target color is not higher than a predetermined value, one of a standard set value of the image processing apparatus, a minimum set value of the image processing apparatus, and an immediately preceding set value can be used as a density level.

When a plurality of colors are designated as target colors, a value obtained by averaging density levels of the respective colors is used as a density level.

When the density levels of the respective colors are to be averaged, a density level which is not higher than a predetermined value is not used for averaging.

When a plurality of colors are designated as target colors, patch images can be formed on the image carrier at density levels of the respective colors, and the first table can be generated for each of the density levels of the respective patches, whereafter the generated first tables are synthesized.

In a second aspect of the present invention, there is provided a control method for an image processing apparatus that transfers an image formed on an image carrier by developing a latent image formed thereon by exposure using an exposure unit, onto a recording medium, comprising a first control step of comparing a result of reading of a gradation pattern formed on a recording medium based on an image signal with the image signal, and controlling an output from the exposure unit such that a gradation of the image signal coincides with a gradation of an image to be recorded on a recording medium, a density setting step of setting a density level of a patch image to be formed on the image carrier based on the output from the exposure unit controlled in the first control step to a different value, on a developer color-by-developer color basis, a detecting step of detecting the density of the patch image formed on the image carrier based on the output from the exposure unit controlled in the first control step, a second control step of controlling the output from the exposure unit such that the density of the patch image detected in the detecting step coincides with a reference density which is a density of the patch image formed on the image carrier based on the output from the exposure unit after control in the first control step, and an image forming control step of combining a first table associating the image signal with the output from the exposure unit and a correction table for use in correcting the image signal such that the density of the patch image detected in the detecting step coincides with the reference density into a second table, and performing image formation using the second table.

In a third aspect of the present invention, there is provided an image processing apparatus comprising a forming unit configured to form a gradation pattern on an image carrier and transfer an image corresponding to the gradation pattern onto a recording medium to thereby form a gradation pattern image on the recording medium, a determination unit configured to read the gradation pattern image formed on the recording medium and determine density correction characteristics of the forming unit, a holding unit configured to hold the density correction characteristics determined by the determination unit, a storage unit configured to store a density of an image formed on the image carrier according to the density correction characteristics, a calculation unit configured to calculate correction amounts associated with respective levels of an input image signal according to relationship between the density stored by the storage unit and a density of an image formed on the image carrier in predetermined timing by setting a density signal level to a different value on a developer color-by-developer color basis, and an adjustment unit configured to adjust the density correction characteristics held by the holding unit, based on the correction amounts calculated by the calculation unit.

An operation for holding the density correction characteristics by the holding unit and an operation for storing the density correction characteristics in the storage unit can be performed when the image processing apparatus is installed.

The features and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
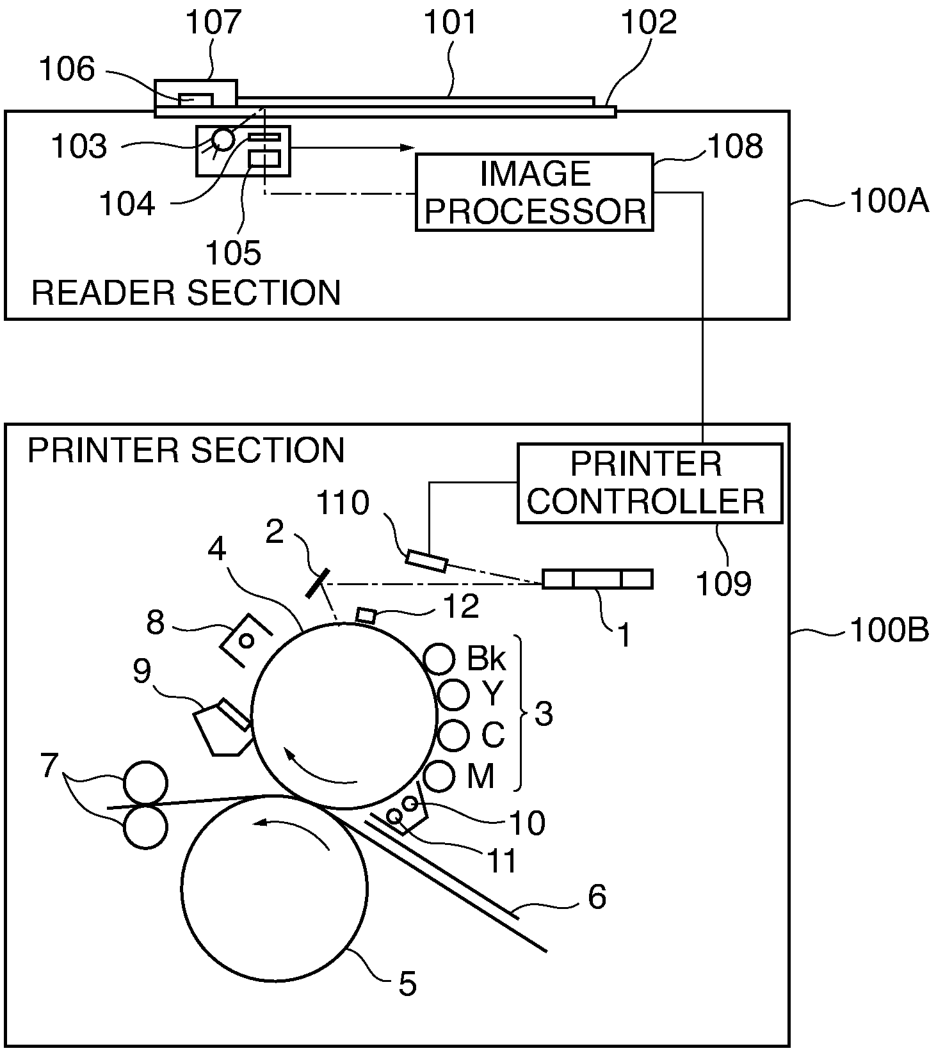
FIG. 1 is a schematic view of an image processing apparatus according to a first embodiment of the present invention.

FIG. 1 is a schematic view of an image processing apparatus according to a first embodiment of the present invention.

Referring to FIG. 1, the image processing apparatus is formed by a full-color copying machine comprised of a reader section 100A for reading an image from an original, and a printer section 100B for forming the image on a sheet. The reader section 100A includes an original platen glass 102, a light source 103, a CCD sensor 105, and an image processor 108. The printer section 100B includes developing devices 3, a photosensitive drum 4, a transfer drum 5, a printer controller 109, and a laser light source 110.

First, a description will be given of the arrangement and operation of the reader section 10A. An original 101 placed on the original platen glass 102 is illuminated by the light source 103, and reflected light from the illuminated original 101 is guided through an optical system 104 to form an optical image on the CCD sensor 105. The CCD sensor 105 generates red (R), green (G), and blue (B) color component signals by respective three R, G, and B CCD line sensors which are arranged in parallel to form a CCD line sensor group. A reader optical unit comprised of the light source 103, the optical system 104, and the CCD sensor 105 scans the original 101 in a direction indicated by an arrow, whereby the optical image read from the original 101 is converted into line-specific electric signal data lines.

Disposed on the original platen glass 102 are an abutment member 107 and a reference white plate 106. The leading end of an original placed on the original platen glass 102 is brought into abutment with the abutment member 107, whereby the original is prevented from being placed askew. The reference white plate 106 is disposed on the surface of the original platen glass 102, as a reference for determining the white level of the CCD sensor 105 and for performing shading processing in a thrust direction.

The CCD sensor 105 photoelectrically converts the optical image from the original 101 into image signals (electric signals) and delivers the image signals to the image processor 108. The image processor 108 performs image processing on the image signals, and then delivers the signals subjected to the image processing to the printer controller 109 of the printer section 100B. The image processor 108 will be described in more detail hereinafter with reference to FIG. 2.

Next, a description will be given of the arrangement and operation of the printer section 100B. The photosensitive drum 4 is uniformly charged by a primary electrostatic charger 8. The printer controller 109 converts image data generated based on the signal delivered from the image processor 108 into a laser beam by a built-in laser driver 27 (see FIG. 4), and emits the laser beam from the laser light source 110. The laser beam is reflected by a polygon mirror 1 and a mirror 2 to be irradiated onto the uniformly charged photosensitive drum 4.

The photosensitive drum 4 is rotated in a direction indicated by an arrow, whereby a latent image is formed on the drum surface by scanning by the laser beam. Each of the developing devices 3 is configured to develop an associated latent image formed on the surface of the photosensitive drum 4, and employs a two-component developing system as a developing method in the present embodiment. The developing devices 3 for respective colors black (Bk), yellow (Y), cyan (C), and magenta (M) are arranged along the outer peripheral surface of the photosensitive drum 4 in the mentioned order from the upstream side of the apparatus. The developing devices 3 sequentially perform a developing operation on a latent image area on the surface of the photosensitive drum 4 in predetermined timing.

On the other hand, a sheet 6 is fed from a sheet cassette, not shown, or a manual feed tray, not shown, and is then wound around the transfer drum 5. Further, the sheet 6 is revolved four times for the respective colors (M, C, Y, Bk in the mentioned order) in accordance with rotation of the transfer drum 5, whereby toner images of the respective colors are transferred onto the sheet 6 in superimposed relation. When the toner image transfer is completed, the sheet 6 is separated from the transfer drum 5 and is then conveyed to a fixing roller pair 7. The fixing roller pair 7 fixes the toner images superimposed on the sheet 6. Thus, a full-color image print is completed.

Further, disposed upstream of the developing device 3 is a surface potential sensor 12 in facing relation to the outer peripheral surface of the photosensitive drum 4. The surface potential sensor 12 detects the surface potential of the photosensitive drum 4. A cleaner 9, an LED light source 10 (that emits light having a main wavelength of approximately 960 nm), and a photodiode 11 are also arranged around the photosensitive drum 4 in facing relation thereto. The cleaner 9 cleans residual toner off the photosensitive drum 4. A photosensor (patch sensor) 40 (see FIG. 4) comprised of the LED light source 10 and the photodiode 11 detects the amount of reflected light from a toner patch pattern formed on the photosensitive drum 4.

Figure 2:
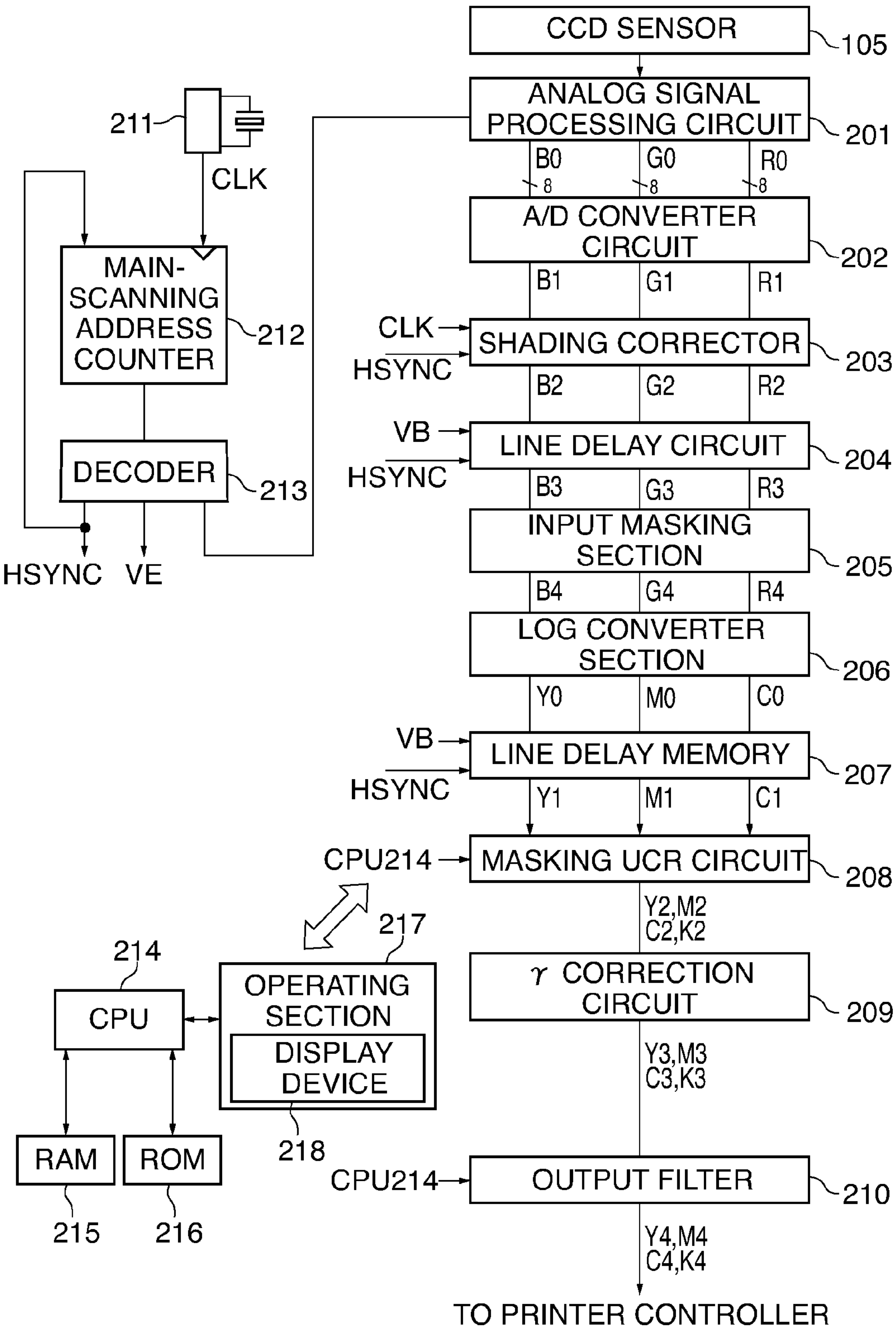
FIG. 2 is a block diagram useful in explaining the flows of image signals in an image processor of a reader section as a component of the image processing apparatus.

FIG. 2 is a block diagram useful in explaining the flows of image signals in the image processor 108 of the reader section 100A.

As shown in FIG. 2, analog image signals output from the CCD sensor 105 are input to an analog signal processing circuit 201. The analog signal processing circuit 201 performs gain adjustment and offset adjustment on the analog image signals, and then outputs these to an A/D converter circuit 202. The A/D converter circuit 202 converts the analog image signals into respective 8-bit digital image signals R1, G1, and B1, and then outputs these to a shading corrector 203. The shading corrector 203 performs known shading correction on a color-by-color basis, using reading signals obtained by reading the reference white plate 106.

On the other hand, a clock generator 211 generates a clock on a pixel basis. A main-scanning address counter 212 counts the clock generated by the clock generator 211, and generates a one-line pixel address output. A decoder 213 decodes main-scanning addresses of the one-line pixel address output delivered from the main-scanning address counter 212, and generates line-by-line CCD drive signals, such as shift pulses and reset pulses, a VE signal indicative of an effective signal region in a one-line reading signal from the CCD, and a line synchronizing signal HSYNC in the main scanning direction. The main-scanning address counter 212 is cleared based on the line synchronizing signal HSYNC, and starts counting the main-scanning address of the next line.

The CCD line sensors forming the CCD sensor 105 are arranged in parallel at predetermined space intervals. For this reason, a line delay circuit 204 corrects spatial shifts in the sub scanning direction. Specifically, the R signal and the G signal are line-delayed in the sub scanning direction relative to the B signal so as to be adjusted to the B signal.

An input masking section 205 converts a reading color space determined by spectral characteristics of the R, G, and B filters of the CCD sensor 105 into an NTCS standard color space, and performs matrix operation based on the following equation (1):

$$\begin{bmatrix} R4 \\ G4 \\ B4 \end{bmatrix} = \begin{bmatrix} a11 & a12 & a13 \\ a21 & a22 & a23 \\ a31 & a32 & a33 \end{bmatrix} \begin{bmatrix} R3 \\ G3 \\ B3 \end{bmatrix} \Lambda \quad (1)$$

A light amount-density converter section (LOG converter section) 206 is formed by a look-up table ROM, and converts luminance signals R4, G4, and B4 into density signals C0, M0 and Y0, respectively. A line delay memory 207 delays the image signals C0, M0, and Y0 by a line delay occurring with determination signals, such as UCR, FILTER, and SEN, generated by a black character determination section (not shown) from the image signals R4, G4, and B4.

A masking UCR circuit 208 extracts a black signal (Bk) from three primary color signals Y1, M1, and C1 input therein. Further, the masking UCR circuit 208 performs calculation for correcting the turbidity of the color of a recording color material (toner) in the printer section 100B and sequentially outputs image signals Y2, M2, C2, and Bk2 with a predetermined bit width (8-bit width) for each reading operation. A γ correction circuit 209 performs density correction so as to match the image signals to ideal gradation characteristics of the printer section 100B. A space filter processing section (output filter) 210 performs edge emphasis processing or smoothing processing on the image signals output from the γ correction circuit 209.

The image processor 108 delivers field-sequential M4, C4, Y4, and Bk4 image signals processed as above to the printer controller 109. The printer controller 109 performs PWM (Pulse Width Modulation) density recording.

A CPU 214 performs the overall operation of the reader section 100A. A RAM 215 provides a work area and a temporary data storage area for the CPU 214. A ROM 216 stores programs to be executed by the CPU 214. An operating section 217 is used by the user for configuring the settings of the image forming operation of the image processing apparatus. The operating section 217 includes a display device 218 and an operating pen (not shown). A target color of an image to be read from an original and a target color of an image displayed on the display device 218 can be designated on the screen of the display device 218 of the operating section 217.

Figure 3:
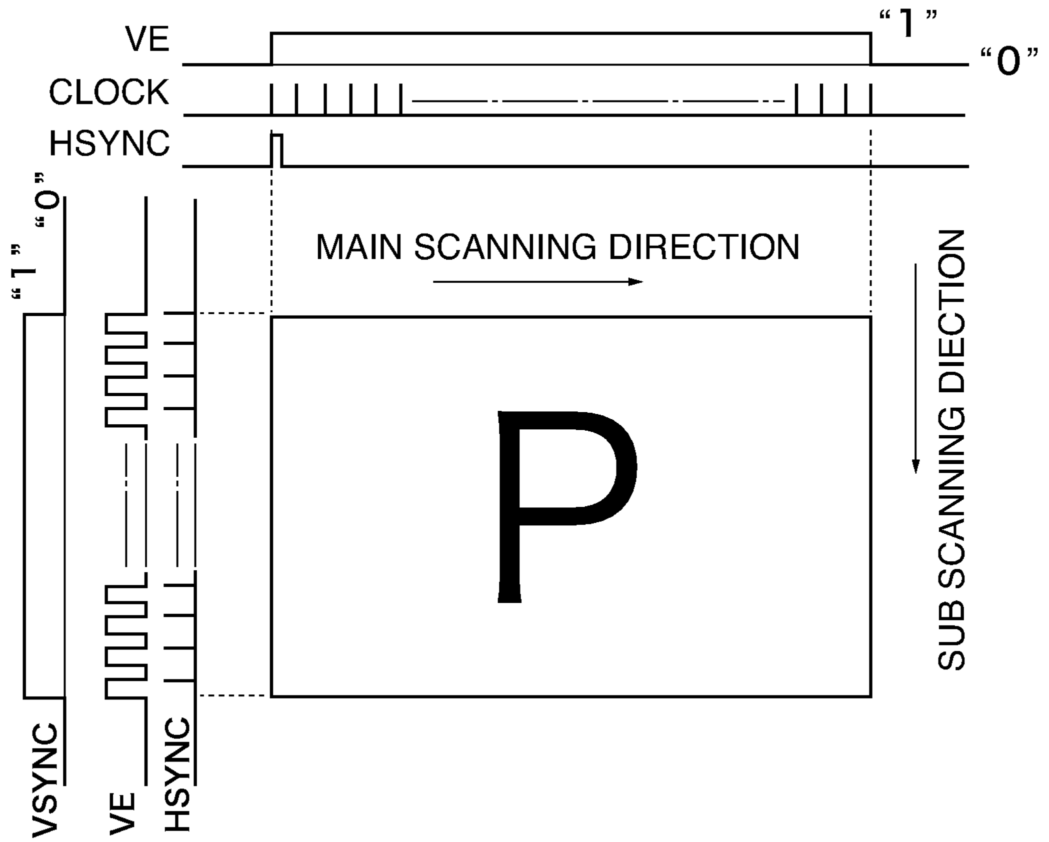
FIG. 3 is a timing diagram of control signals in the image processor.

FIG. 3 is a timing diagram of control signals in the image processor 108.

Referring to FIG. 3, a CLOCK signal is a basic signal in the present embodiment, and pixel-by-pixel image processing is performed in synchronism with a rise of a CLOCK signal pulse (the CLOCK signal is a pixel synchronizing signal, and is used to transmit image data in rise timing from a logic 0 to a logic 1). The HSYNC signal is a main-scanning synchronizing signal, and main scanning is started in synchronism with a rise of an HSYNC signal pulse. The VE signal is an effective image section signal in the main scanning direction. Timing of a main scanning start position is determined by a section during which the VE signal has a logic 1, and the VE signal is basically used for performing line counting control for line delay. A VSYNC signal is an effective image section signal in the sub scanning direction. Image reading (scanning) is performed over a section where the VSYNC signal has a logic 1 whereby output signals (M), (C), (Y), and (Bk) are sequentially formed. Control is provided such that an image is captured only over the sections determined by the VE signal and the VSYNC signal (where they have a logic 1).

Figure 4:
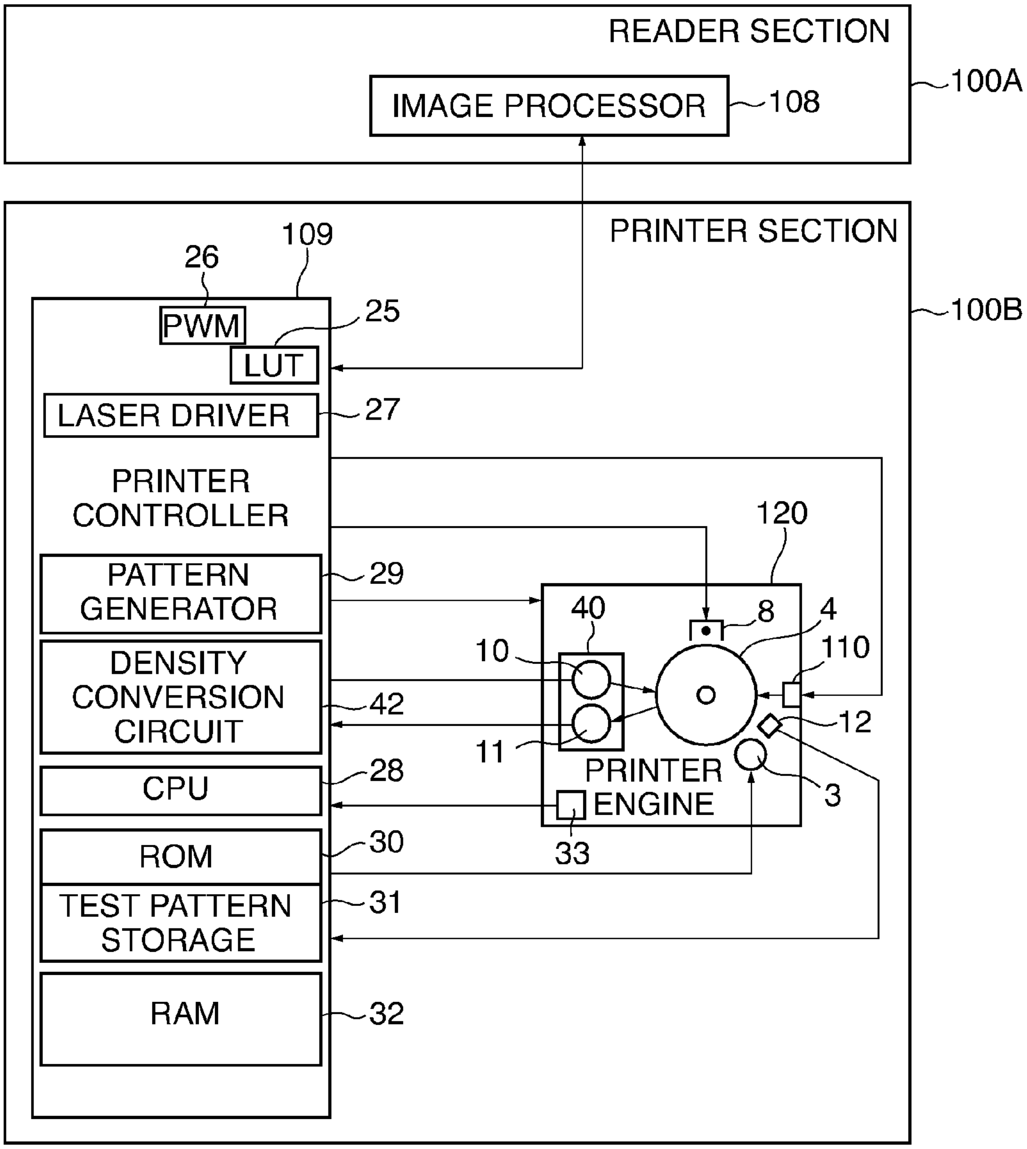
FIG. 4 is a block diagram of a printer controller and a printer engine of a printer section as a component of the image processing apparatus.

FIG. 4 is a block diagram of the printer controller 109 and a printer engine 120 of the printer section 100B.

As shown in FIG. 4, the printer controller 109 is comprised of a CPU 28, a ROM 30, a RAM 32, a LUT (Look Up Table) 25, a pulse width modulation (PWM) circuit 26, the laser driver 27, a pattern generator 29, a test pattern storage 31, and a density conversion circuit 42. The printer controller 109 is capable of performing communication with the printer engine 120 of the printer section 100B and the image processor 108 of the reader section 100A.

The CPU 28 controls the overall operation of the printer section 100B. The CPU 28 executes processes shown in respective flowcharts, described hereinafter, based on associated programs. The ROM 30 stores the programs to be executed by the CPU 28. The RAM 32 provides a work area and a temporary data storage area for the CPU 28. The LUT 25 is generated by a first control, as described hereinafter. The pulse width modulation circuit 26 converts a density signal into a signal corresponding to a dot width, as described hereinafter. The laser driver 27 performs ON/OFF control of the laser light source 110. The pattern generator 29 generates a predetermined oscillation frequency. The test pattern storage 31 stores patterns for use in test printing. The density conversion circuit 42 converts image signals generated based on original scanning into image density signals.

The printer engine 120 is comprised of the primary electrostatic charger 8, the developing devices 3, the surface potential sensor 12, the laser light source 110, the photosensor (patch sensor) 40 comprised of the LED light source 10 and the photodiode 11, and an environment sensor 33. The printer engine 120 is controlled by the printer controller 109.

The surface potential sensor 12 is disposed upstream of the developing devices 3 to detect the surface potential of the photosensitive drum 4. The grid potential of the primary electrostatic charger 8 and the developing bias potential of each of the developing devices 3 are controlled by the CPU 28 based the detection by the surface potential sensor 12. The environment sensor 33 measures the moisture content of air within the image processing apparatus. The photosensor 40 detects the amount of reflected light from a toner patch pattern formed on the photosensitive drum, as described above.

Figure 5:
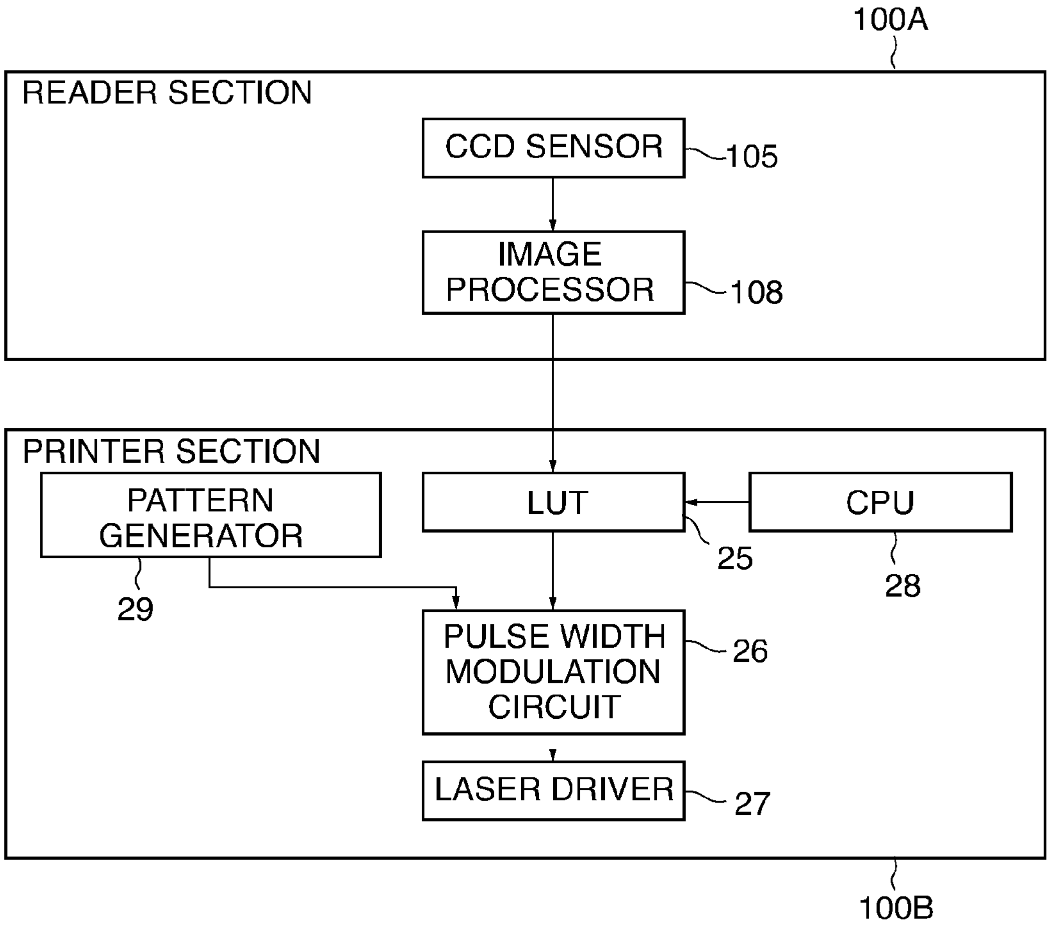
FIG. 5 is a block diagram of an image signal processing circuit formed by the reader section and the printer section, for obtaining gradation images.

FIG. 5 is a block diagram of an image signal processing circuit formed by parts or units of the reader section 100A and the printer section 100B, for obtaining gradation images.

Referring to FIG. 5, in the reader section 100A, the luminance signals (analog image signals) of an image read from an original are obtained by the CCD sensor 105 and are converted into field-sequential image signals by the image processor 108, as described hereinbefore. Each of these image signals is represented by an image signal containing γ characteristics of the printer section 100B set to the default settings, and has its density characteristics converted based on the LUT 25 such that the density of the original image becomes equal to that of an output image.

Figure 6:
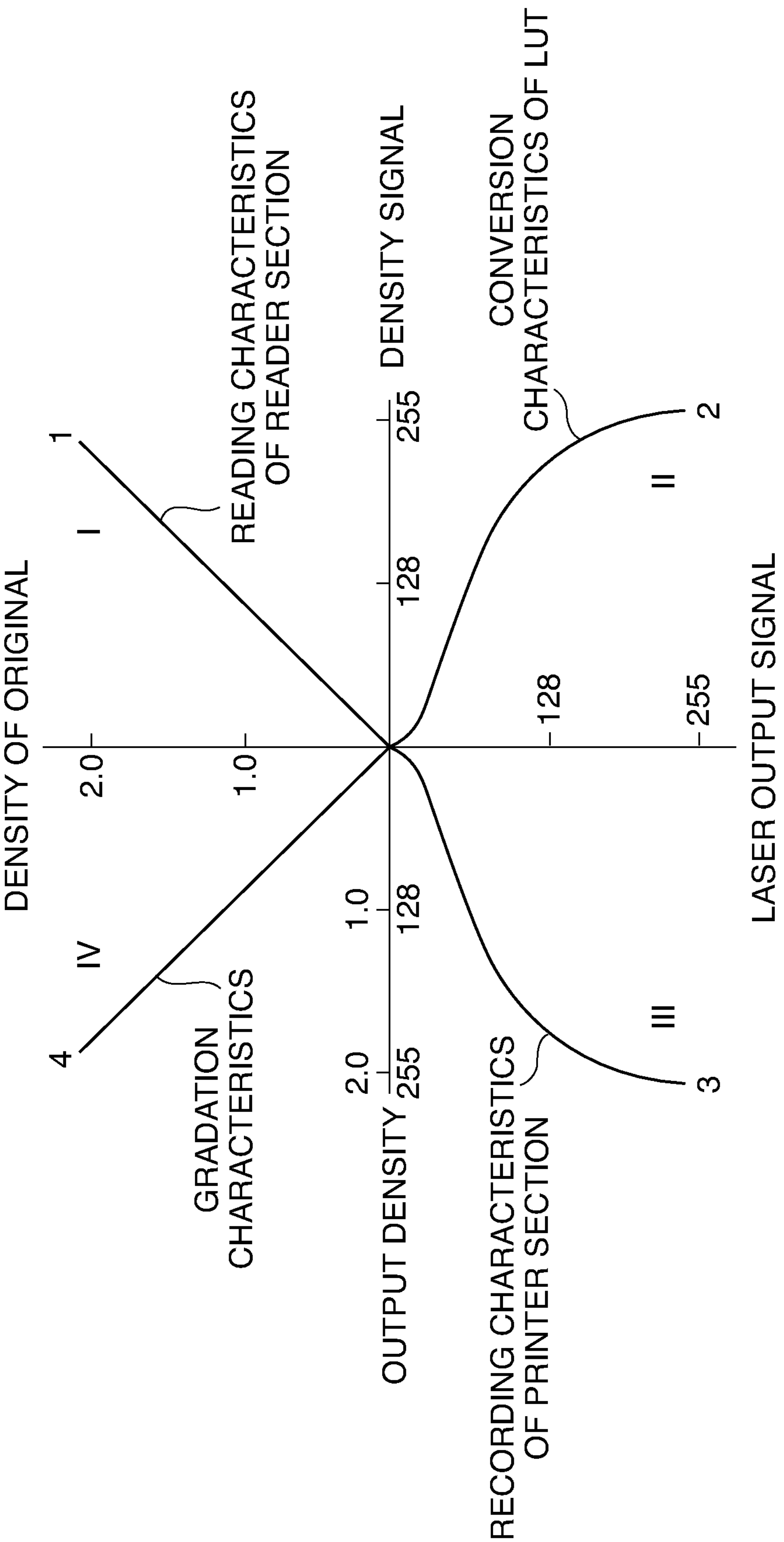
FIG. 6 is a four-quadrant chart showing how a gradation is reproduced.

FIG. 6 is a four-quadrant chart showing how a gradation is reproduced.

Referring to FIG. 6, a quadrant I shows the reading characteristics of the reader section 100A for converting the image density of an original into a density signal. A quadrant II shows the conversion characteristics of the LUT 25 for converting the density signal into an output signal from the laser driver 27. A quadrant III shows the recording characteristics of the printer section 100B for converting the output signal from the laser driver 27 into an output density. A quadrant IV shows gradation characteristics indicative of the relationship between the density of the image of the original and the output density of an image printed on a sheet. The four-quadrant chart shows the total gradation reproduction characteristics of the image processing apparatus. Image processing is performed using 8-bit digital signals, and therefore the number of gradation levels is 256.

In the present image processing apparatus, in order to make the gradation characteristics in the quadrant IV linear, the non-linearity of the recording characteristics of the printer section 100B in the quadrant III is corrected by the conversion characteristics of the LUT 25 in the quadrant II. The LUT 25 is generated by calculation in the first control, described in detail hereinafter. The density signal is subjected to density conversion based on the LUT 25 and is then converted into a signal corresponding to a dot width by the pulse width modulation circuit 26, followed by being delivered to the laser driver 27 that performs ON/OFF control of the laser light source 110. In the present embodiment, a gradation reproducing method using pulse width modulation is employed for all the colors Y, M, C, and Bk.

On the photosensitive drum, a latent image having predetermined gradation characteristics dependent on variation in dot area is formed by scanning with a laser beam output from the laser light source 110. Thereafter, a gradation image is reproduced (formed) on a sheet through the aforementioned development, transfer, and fixing processes.

In the image processing apparatus according to the present embodiment, the first control and a second control are executed by a first control system and a second control system, respectively, as described in detail hereinbelow. In the first control, the result of reading of a gradation pattern formed on a sheet based on an image signal is compared with the image signal, and the output from the laser driver 27 is controlled such that the gradation of the image signal becomes equal to that of an image recorded on a sheet. In the second control, the output from the laser driver 27 is controlled such that the density of a patch image detected by the photosensor 40 becomes equal to a reference density of the patch image formed on the photosensitive drum based on the output from the laser driver 27 immediately after execution of the first control.

First, a detailed description will be given of the first control executed for stabilization of the image reproducing characteristics of the system including both the reader section 100A and the printer section 100B of the image processing apparatus.

First, a calibration (adjustment) control process for controlling the printer section 100B using the reader section 100A will be described with reference to a flowchart in FIG. 7.

Figure 7:
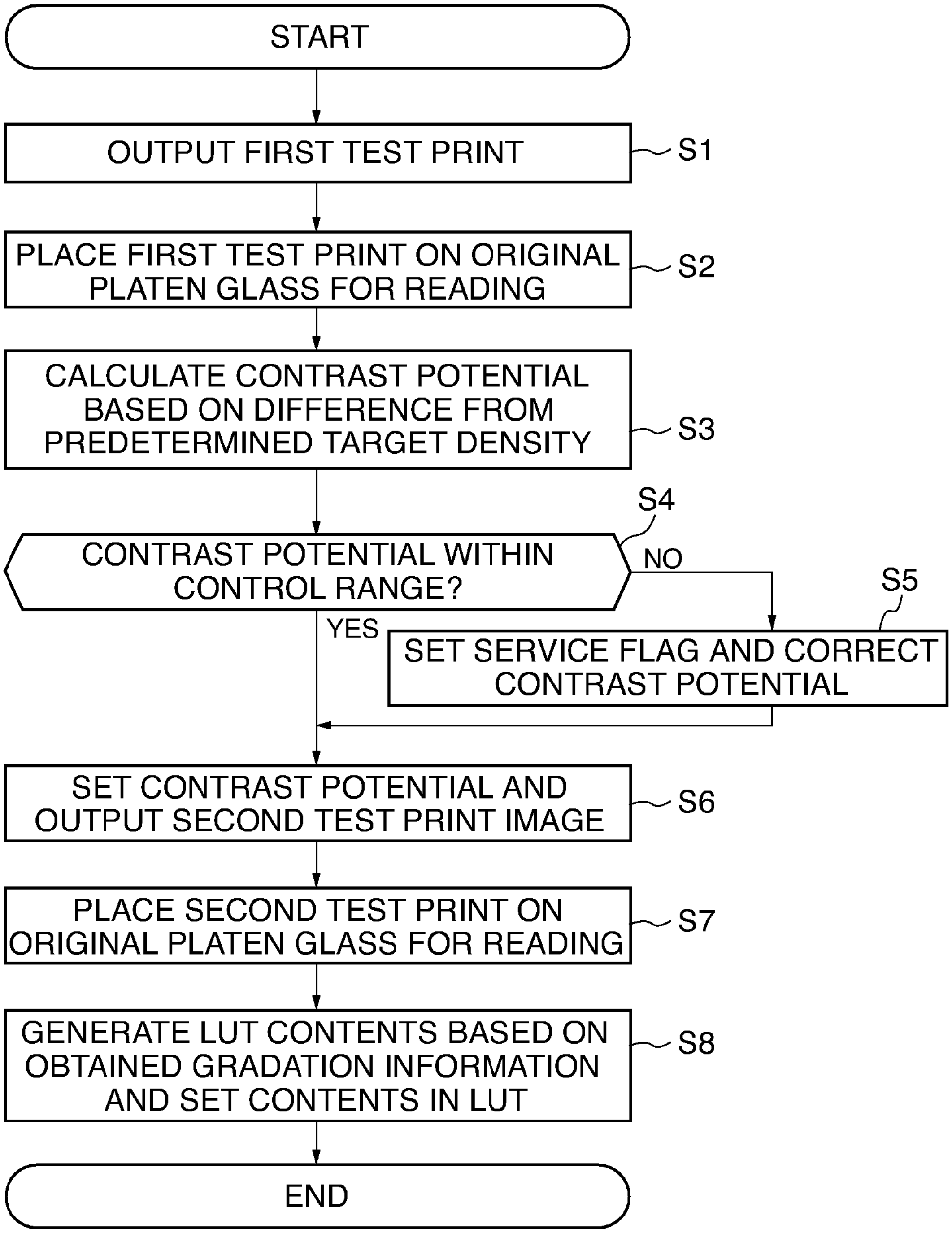
FIG. 7 is a flowchart of a calibration control process for calibrating the printer section using the reader section.

FIG. 7 shows the calibration control process. The present process is executed by the CPU 214 of the reader section 100A and the CPU 28 of the printer section 100B based on programs.

The process is started when the operator presses an automatic gradation correction mode-setting button (not shown) provided in the operating section 217. It should be noted that in the present embodiment, the display device 218 included in the operating section 217 is implemented by a liquid crystal operating panel with push sensors (touch panel display), which is illustrated in FIGS. 8A to 10E, and the operator can directly operate the display device 218. In the following, steps in FIG. 7 will be described in detail.

<First Test Printing Output: Step S1>

Figure 8A:
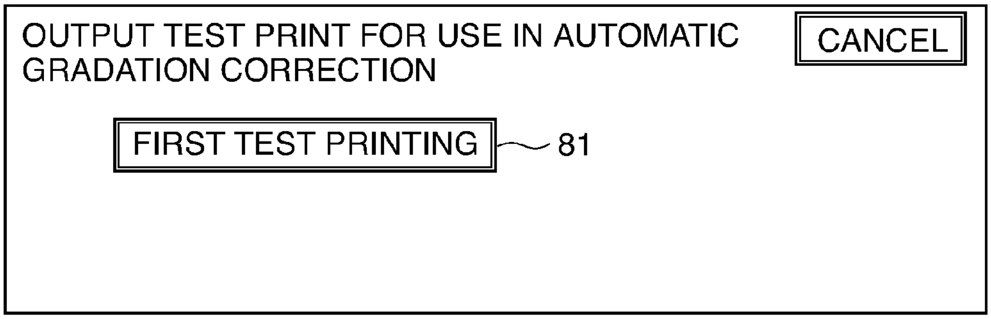
FIGS. 8A to 8C are views illustrating respective examples of screens displayed on a display device when an automatic gradation correction mode is set via an operating section.

In the step S1, the CPU 214 of the reader section 100A displays a print start button 81 for first test printing on the display device 218 (see FIG. 8A). When the operator presses the print start button 81 for first test printing, the CPU 28 of the printer section 100B causes the printer engine 120 to print out a belt-like pattern 61 as a first test print image shown in FIG. 11.

Figure 8B:
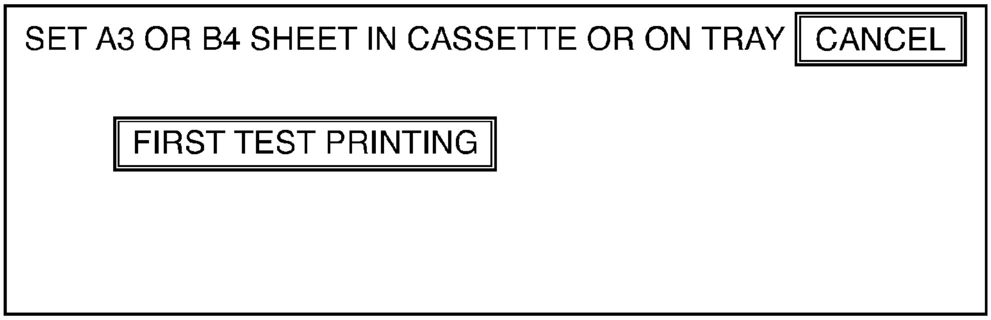
Figure 8C:
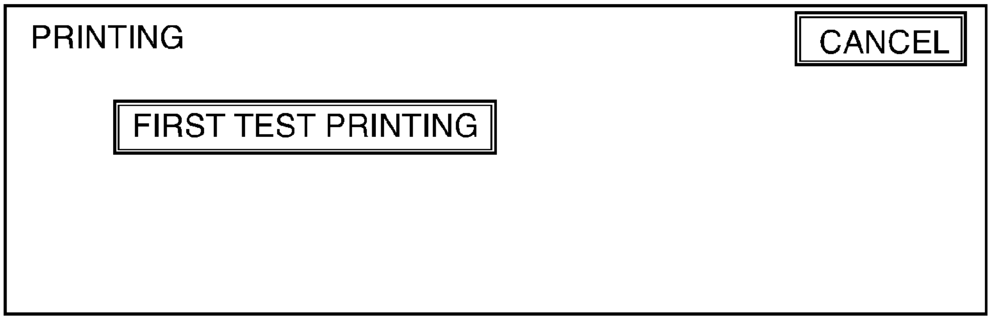

In this step, the CPU 214 of the reader section 100A determines whether or not a sheet on which the first test print image is to be formed is contained in a sheet cassette. If the sheet is not present, the CPU 214 displays a warning message, as shown in FIG. 8B by way of example, on the display device 218. In the case of forming the first test print image, a standard contrast potential (described hereinafter) corresponding to the environment of the image processing apparatus is registered and used as a default value.

The image processing apparatus is provided with a plurality of sheet cassettes so that a sheet size can be selected from a plurality of sizes, such as B4, A3, A4, and B5. However, to avoid an error due to confusion between a portrait orientation and a landscape orientation in which a sheet should be set in the reading operation of the reader section 100A, the present control process is configured such that a so-called large-size sheet, i.e. a B4 sheet, an A3 sheet, an 11×17 sheet, or an LGR sheet, is used.

Figure 11:
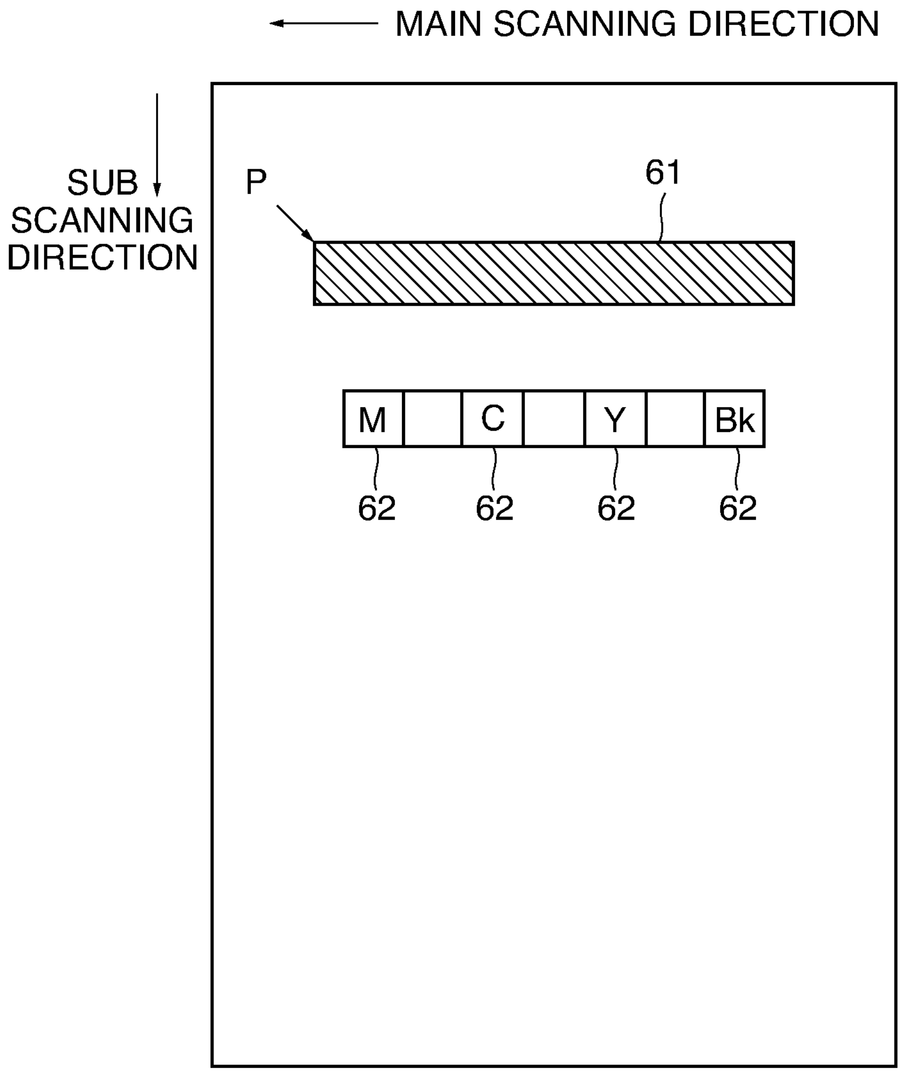
FIG. 11 is a view illustrating a belt-like pattern for first test printing.

As the first test print image, the belt-like pattern 61 is formed which has an intermediate gradation density for each of the four colors Y, M, C, and Bk, as shown in FIG. 11. A service person visually inspects the belt-like pattern 61 to check if there is an abnormal image streak, a density irregularity or a color irregularity. The size of the belt-like pattern 61 in the main scanning direction of the CCD sensor 105 is set such that the belt-like pattern 61 can cover a patch pattern 62, appearing in FIG. 11, and gradation patterns 71 and 72 for use in second test printing (see FIG. 12) in the thrust direction.

If there is an abnormality detected in the belt-like pattern 61, the first test print image is printed again by the printer section 100B. Then, when there is an abnormality detected in the belt-like pattern 61 again, a call is made to request the service person to check the image processing apparatus. It should be noted that it is also possible to read the belt-like pattern 61 by the reader section 100A and automatically determine, based on density information thereof in the thrust direction, whether or not subsequent control processing should be performed. On the other hand, the patch pattern 62 is comprised of maximum density patches for the respective colors Y, M, C, and Bk, and each of the patches corresponds to a density signal level of 255.

<Reading of First Test Print Image: Step S2>

Figure 9A:
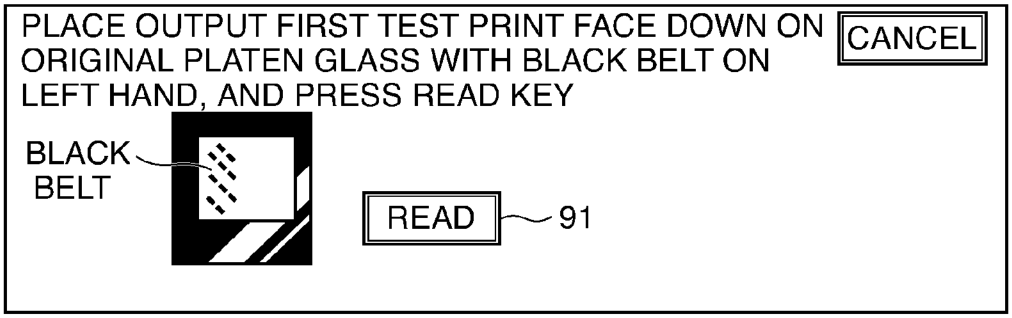
FIGS. 9A to 9C are views illustrating respective examples of screens displayed on the display device when the automatic gradation correction mode is set via the operating section.
Figure 13:
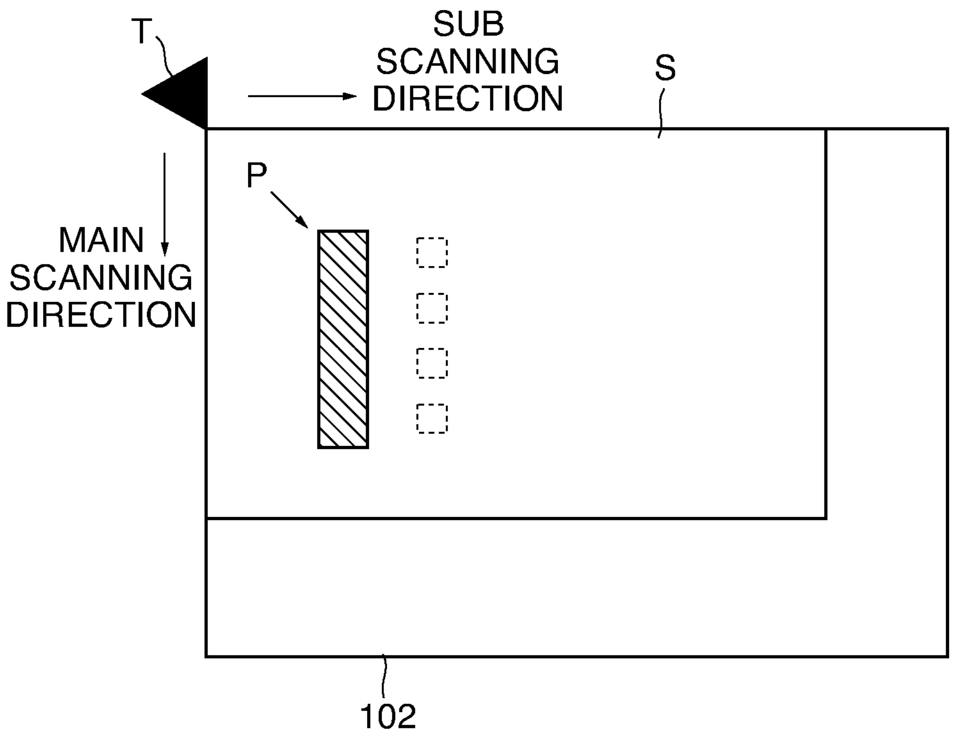
FIG. 13 is a view showing a state in which an original for the first test printing is placed on an original platen glass.

In the step S2, the operator places the sheet having the first test print image formed thereon on the original platen glass 102 as shown in FIG. 13, and presses a reading button 91 appearing in FIG. 9A. As a consequence, an operator guidance shown in FIG. 9A is displayed on the display device 218.

FIG. 13 is a schematic view of the original platen glass 102 as viewed from above. A triangular mark on the upper left corner is an original abutment mark T on the original platen glass 102. A message is displayed as the operator guidance on the display device 218 (see FIG. 9A) so that the operator can place the sheet S on the original platen glass 102, with a belt-like pattern side thereof oriented toward the original abutment mark T and with the front face thereof on the original platen glass 102. This makes it possible to prevent occurrence of control error due to wrong placing of the sheet S.

In reading the patch pattern 62 on the sheet S by the reader section 100A, the sheet S is progressively scanned starting from the original abutment mark T, whereby a first density gap point P is obtained at a corner of the belt-like pattern 61. This causes the CPU 214 of the reader section 100A to calculate the positions of the respective patches of the patch pattern 62 as relative coordinates with respect to the coordinate point of the density gap point P whereby the density value of each path of the patch pattern 62 is read.

Figure 9B:
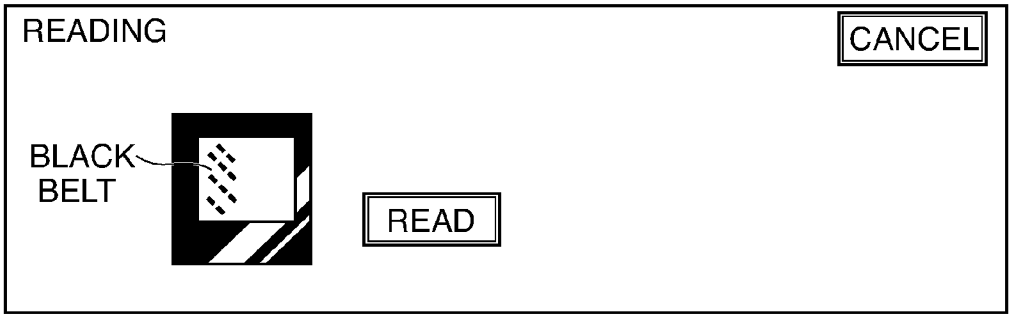
Figure 9C:
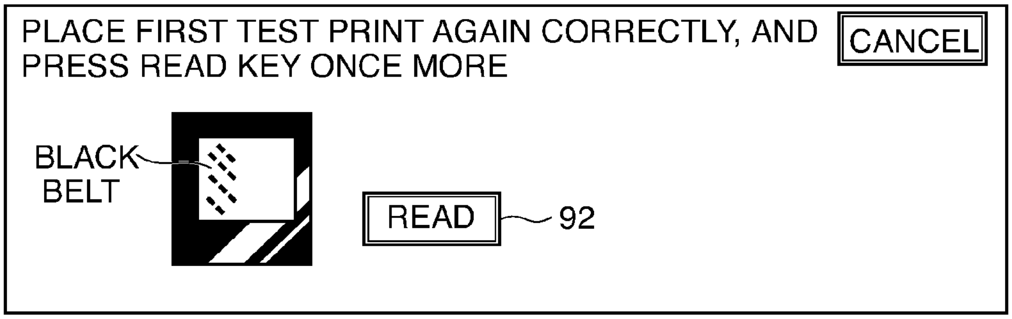

During the reading of the density value of the patch pattern 62, the CPU 214 of the reader section 100A displays a message shown in FIG. 9B on the display device 218. Further, when the first test print image cannot be read due to incorrect orientation or position of the sheet S, the CPU 214 of the reader section 100A displays a message shown in FIG. 9C on the display device 218. In this case, when the operator corrects the orientation or position of the sheet S and presses a reading key 92, the reader section 100A restarts the reading operation.

To convert R, G, and B values obtained by reading the patch pattern 62 into respective optical density levels, the following equations (2) are used:

$$\left.\begin{aligned} M &= -km \times \log10(G/255) \\ C &= -kc \times \log10(R255) \\ Y &= -ky \times \log10(B255) \\ Bk &= -kbk \times \log10(G/255) \end{aligned}\right\}\Lambda \quad (2)$$

In the equations (2), a correction coefficient k is used to adjust density information so as to obtain the same values as those provided by a commercially available densitometer. Further, another LUT may be used to convert R, G, and B luminance information into M, C, Y, and Bk density information.

<Calculation of Contrast Potential: Step S3>

Figure 15:
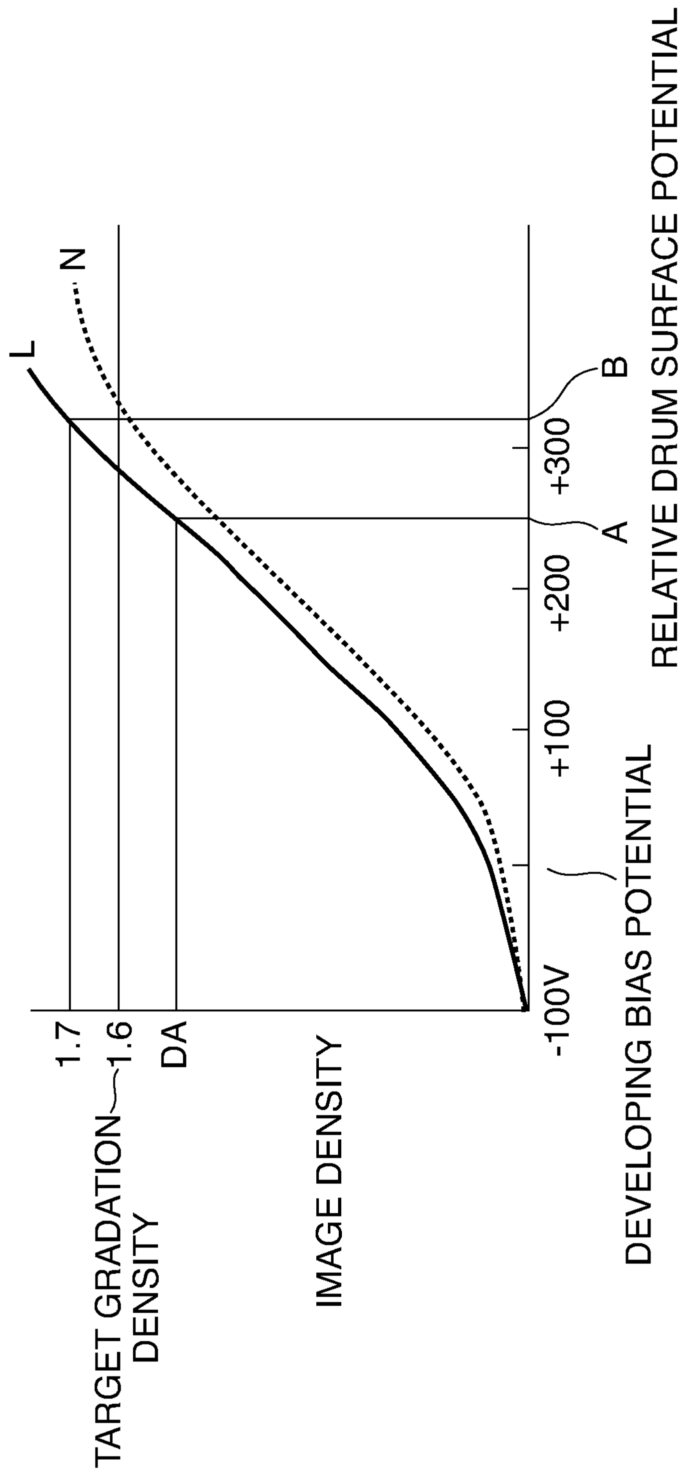
FIG. 15 is a diagram showing the relationship between relative drum-surface potential and image density obtained by calculation.

Next, a description will be given of a method of correcting a maximum density based on the density information obtained in the step S2. FIG. 15 shows the relationship between a relative drum surface potential (contrast potential) and the image density obtained by the above-mentioned calculation. Let it be assumed that when the contrast potential, i.e. the difference between the developing bias potential and the surface potential of the photosensitive drum 4 which is maximized by laser beam irradiation after the photosensitive drum 4 having been primarily charged is set to a value of A, the maximum density obtained is equal to DA. In this case, in the maximum density area, the image density generally corresponds linearly to the relative drum surface potential, as shown by a solid line L in FIG. 15.

However, in a case where the two-component developing system is employed as a developing method, when toner density in the developing device changes to a lower level, the image density with respect to the relative drum surface potential in the maximum density area can become non-linear as shown by a broken line N in FIG. 15. Therefore, in the illustrated example, although a final target value of the maximum density is set to 1.6, a control target value to which the maximum density is to be controlled is increased to a value of 1.7 so as to allow for a margin of 0.1, whereby a controlled variable is determined. A contrast potential B corresponding to this control target value is calculated using the following equation (3):

$$B=(A+Ka)\times 1.7/DA \quad (3)$$

In the equation (3), Ka represents a correction coefficient. It is preferable that the value of the correction coefficient is optimized according to the type of a developing method.

Figure 16:
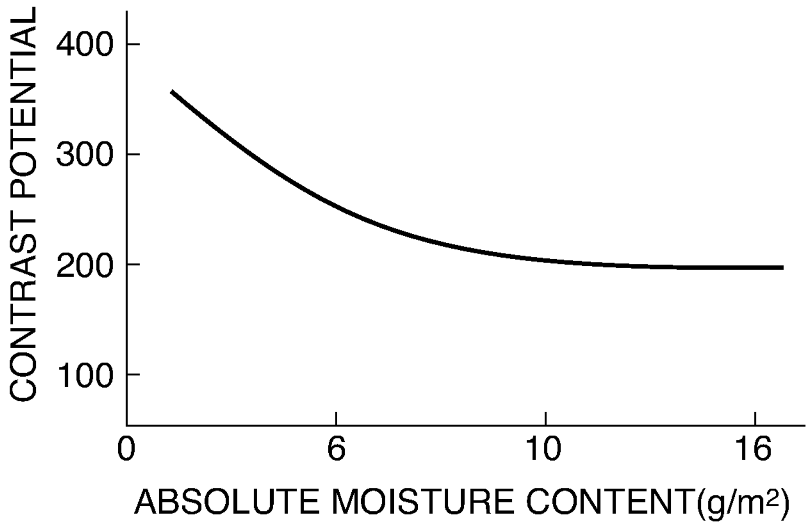
FIG. 16 is a diagram showing the relationship between absolute moisture content and contrast potential.

Actually, in an image processing apparatus that performs image formation by the electrophotographic method, if the contrast potential A is not varied in accordance with the environment, it is impossible to obtain an appropriate image density. For this reason, as shown in FIG. 16, the setting of the contrast potential is varied with the output from the environment sensor 33 monitoring the moisture content of the air in the image processing apparatus.

Therefore, to correct the contrast potential, a correction coefficient Vcont·rate obtained by the following equation (4) is stored in a RAM backed up by a battery:

$$\text{Vcont·rate}=B/A \quad (4)$$

The CPU 28 of the printer section 100B measures changes in the environment (moisture content) at predetermined time intervals (e.g. 30 minutes), and whenever determining the value A in FIG. 15 based on the result of the measurement, it calculates A×Vcont·rate to determine the contrast potential.

Figure 17:
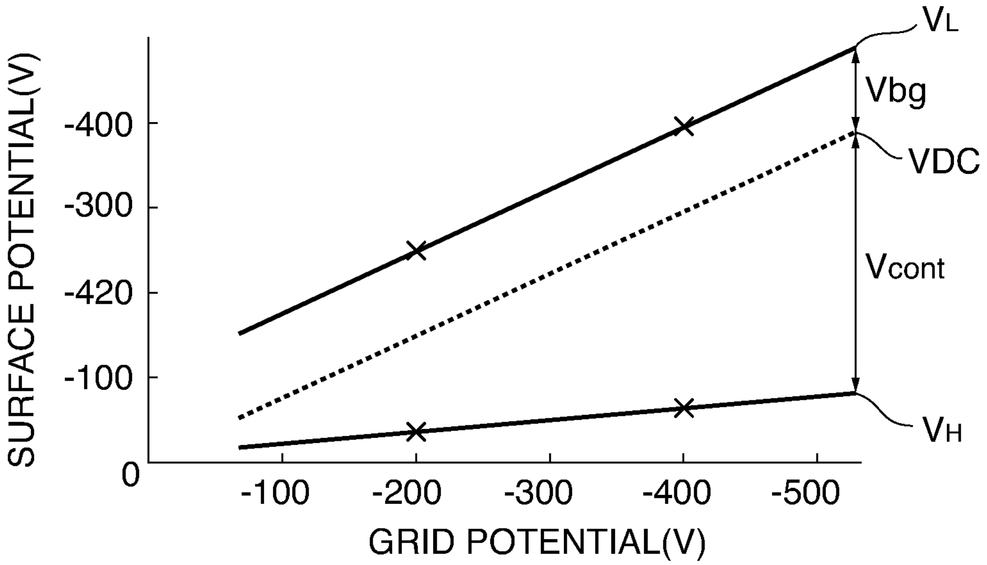
FIG. 17 is a diagram showing the relationship between the grid potential of a primary electrostatic charger and the surface potential of a photosensitive drum.
Figure 18:
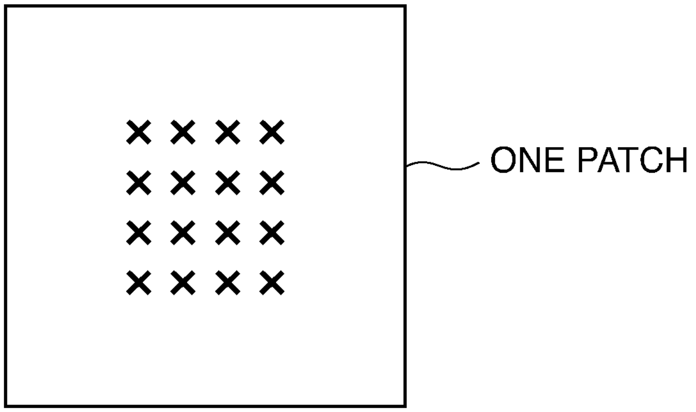
FIG. 18 is a view of reading points per one patch for test printing.

Now, a brief description will be given of a method of determining the grid potential of the primary electrostatic charger 8 and the developing bias potential of the developing device 3 based on the above-described contrast potential. FIG. 17 shows the relationship between the grid potential of the primary electrostatic charger 8 and the surface potential of the photosensitive drum 4. The grid potential of the primary electrostatic charger 8 is set to −200 V, and a surface potential VL of the photosensitive drum 4 scanned at a minimum laser beam level and a surface potential VH of the photosensitive drum 4 scanned at a maximum laser beam level are measured by the surface potential sensor 12. Similarly, the surface potential VL and the surface potential VH determined when the grid potential is set to −400 V are measured by the surface potential sensor 12.

The relationship between the grid potential of the primary electrostatic charger 8 and the surface potential of the photosensitive drum 4 can be determined by performing linear interpolation (connecting two points by a line) and extrapolation (extending a line outward from two points) on data acquired when the grid potential is set to −200 V and data acquired when the grid potential is set to −400 V. The control for determining this potential data is referred to as potential measurement control. With reference to the surface potential VL of the photosensitive drum 4, the developing bias potential VDC is set by setting a difference Vbg from the surface potential VL such that fogging toner (excess toner) is prevented from adhering to an image (to 100 V in the illustrated example).

The contrast potential Vcont is a differential voltage between the developing bias VDC and the surface potential VH, and as the contrast potential Vcont is increased, the maximum density can be increased, as described hereinabove. A value of the grid potential and a value of the developing bias potential required for obtaining the contrast potential B determined by calculation can be calculated based on the relationship shown in FIG. 17.

In the step S3, the CPU 28 of the printer section 100B determines the contrast potential such that the maximum density becomes higher than the final target value by 0.1, and the grid potential and the developing bias potential are set to respective values which make it possible to obtain the determined contrast potential.

<Comparison of Contrast Potential: Step S4>

In the step S4, the CPU 28 of the printer section 100B determines whether or not the contrast potential obtained in the step S3 is within a control range.

<Correction of Contrast Potential: Step S5>

If the CPU 28 of the printer section 100B determines that the contrast potential is outside the control range, it is judged that an abnormality has occurred in a developing device or the like, and the process proceeds to a step S5, wherein a service error flag is set so as to urge the service person to check a developing device associated with the color. Thus, the service person can recognize the service error flag on the display device 218 of the operating section 217 in a predetermined service mode of the image processing apparatus. Under the abnormal condition where the contrast potential is outside the control range, the CPU 28 of the printer section 100B applies a limiter to a limit value defining the control range to thereby correct the contrast potential, and continues the control. The CPU 28 of the printer section 100B sets the grid potential and the developing bias potential such that the contrast potential calculated in the step S3 is obtained.

Figure 20:
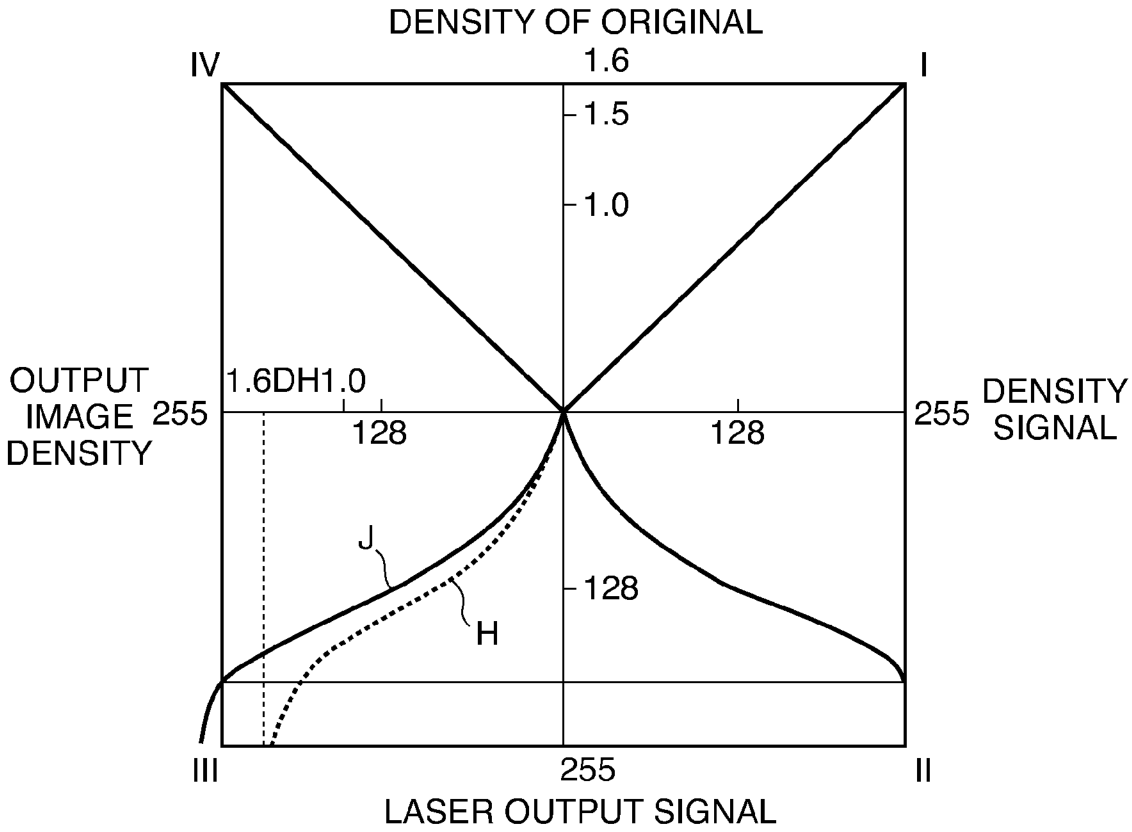
FIG. 20 is a diagram showing density conversion characteristics.

FIG. 20 shows density conversion characteristics. In the present embodiment, by performing maximum density control for setting the maximum density to a higher value than the final target value, printer characteristics indicated by a solid line J in the quadrant III are obtained. If the maximum density control is not performed, the printer characteristics can be such as indicated by a broken line H, and in this case the maximum density could not reach 1.6. In a case where the printer section 100B has the characteristics indicated by the broken line H, since the LUT 25 is not capable of increasing the maximum density however it may be set, the maximum density is held below 1.6, which makes density reproduction impossible. On the other hand, when the maximum density is set to a value slightly higher than the final target value as shown by the solid line J, it is possible to reliably secure a density reproduction range based on the total gradation characteristics in the quadrant IV.

<Output of Second Test Print Image: Step S6>

Figure 10A:
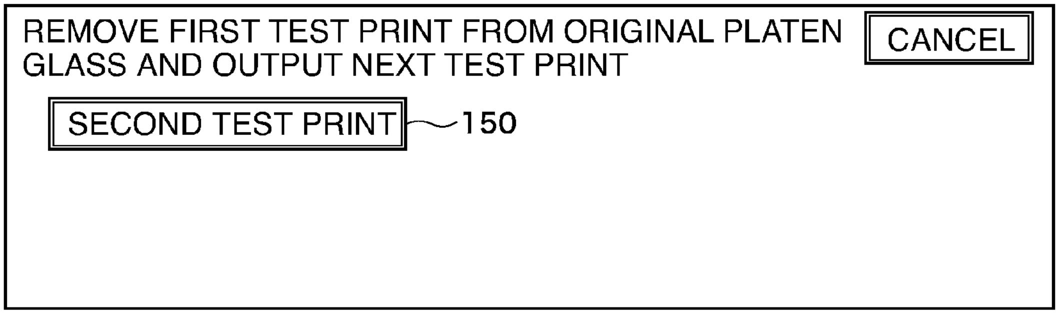
FIGS. 10A to 10E are views illustrating respective examples of screens displayed on the display device when the automatic gradation correction mode is set via the operating section.
Figure 10B:
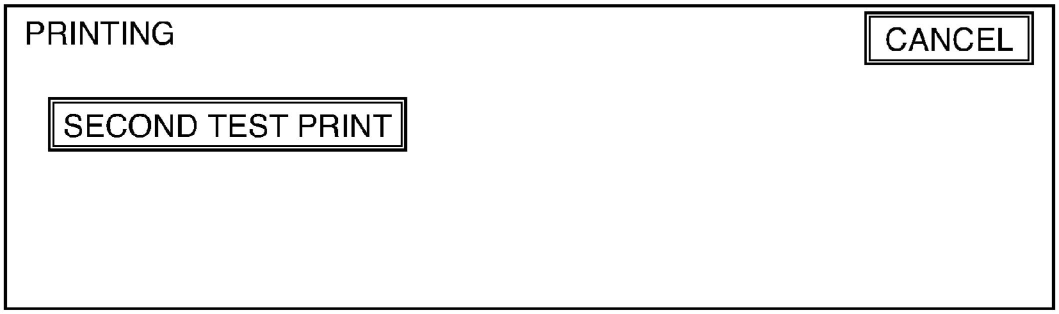
Figure 10C:
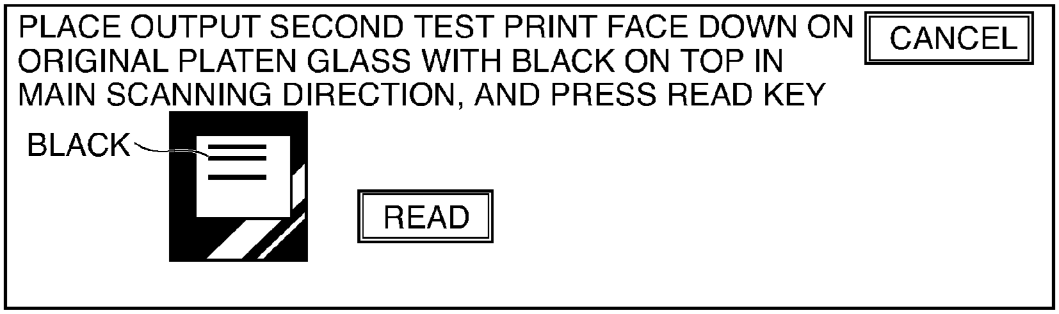
Figure 10D:
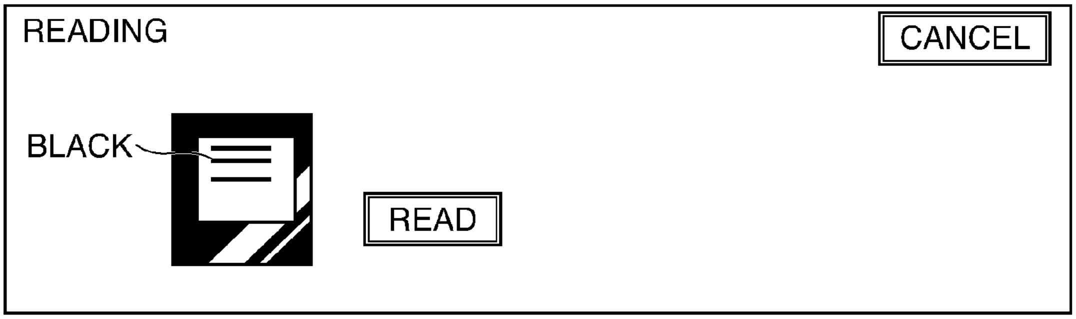
Figure 10E:
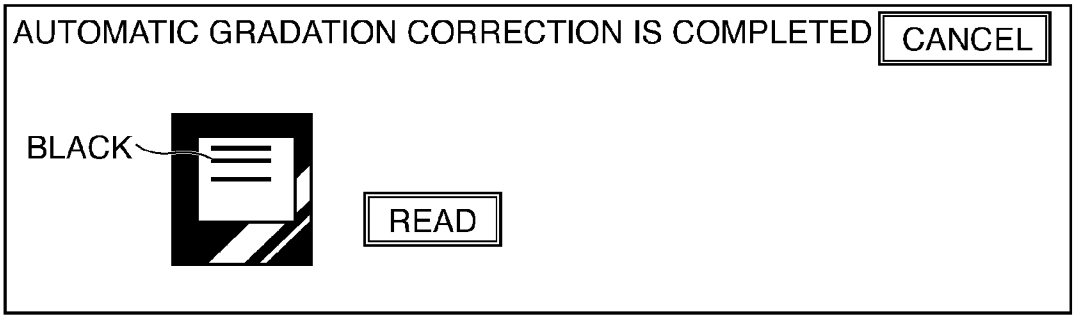
Figure 12:
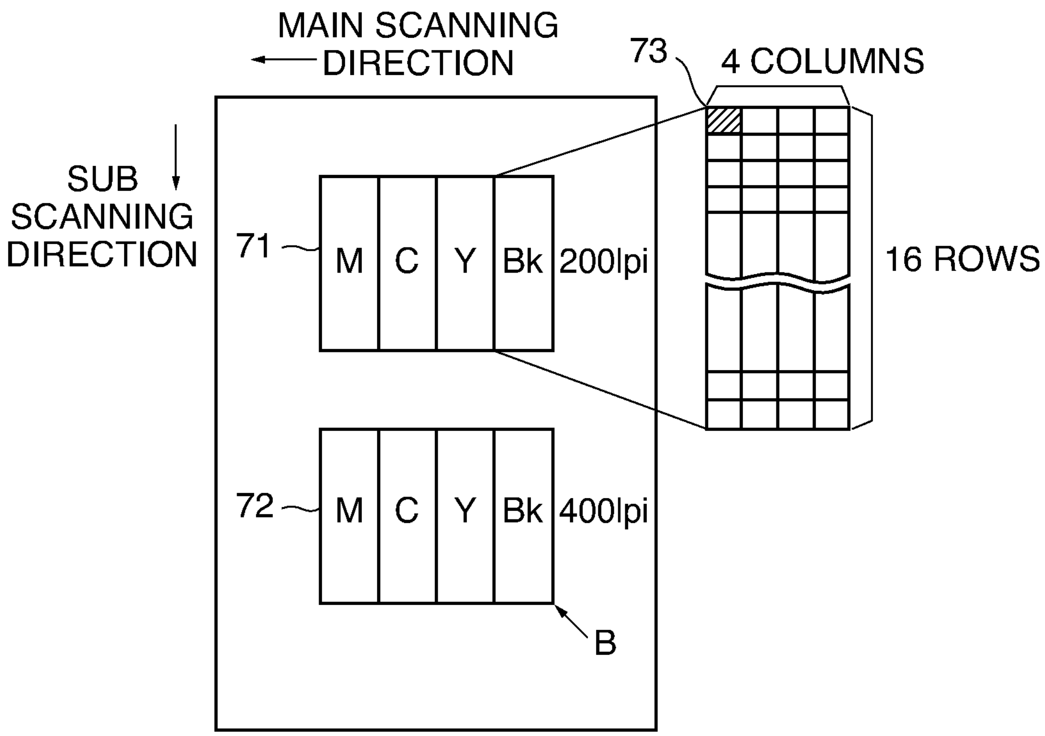
FIG. 12 is a view illustrating gradation patterns for second test printing.

Next, in the step S6, the CPU 214 of the reader section 100A causes the display device 218 to display a print start button 150 for the second test printing as shown in FIG. 10A. When the operator presses the print start button 150, the CPU 28 of the printer section 100B causes the printer engine 120 to print out an image for the second test printing as shown in FIG. 12. During the printing operation, a message shown in FIG. 10B is displayed on the display device 218.

The second test print image is comprised of gradation patch groups each formed by patches for the respective colors Y, M, C, and Bk, and each of the gradation patches is comprised of 4 (columns)×16 (lines) gradations, i.e. 64 gradations in total. As for the 64 gradations, laser output levels are mainly assigned to gradations belonging to a low-density range of the 256 gradations, whereas laser output levels are thinned out in a high-density range. This is done so as to favorably adjust gradation characteristics in highlighted portions (low-density range) in particular. The second test print image is generated by the pattern generator 29 without using the LUT 25.

The gradation pattern (patches) 71 shown in FIG. 12 has a resolution of 200 lpi (lines/inch), and the gradation pattern (patches) 72 also shown in FIG. 12 has a resolution of 400 lpi. Formation of images of the respective resolutions can be achieved by providing a plurality of cycles of triangular waves for use in comparison with image data to be processed.

It should be noted that the present image processing apparatus forms gradation images at a resolution of 200 lpi and forms line images, such as characters, at a resolution of 400 lpi. In the present embodiment, gradation patterns are output at the two resolutions for the same gradation levels. However, when difference in resolution causes a significant difference in gradation characteristics, it is more preferable to configure the gradation levels according to a resolution.

<Reading of Second Test Print Image: Step S7>

Figure 14:
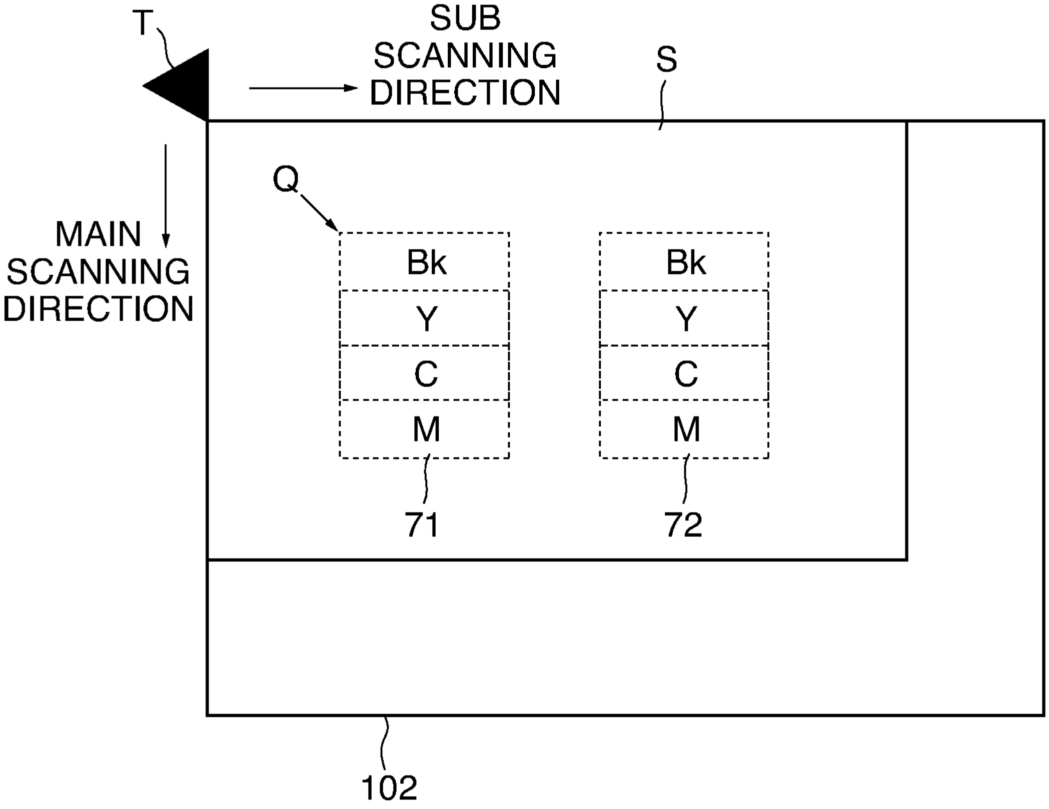
FIG. 14 is a view showing a state in which an original for the second test printing is placed on the original platen glass.

FIG. 14 is a view of an output image of the second test printing, as viewed from above, which is placed on the original platen glass. A triangular mark on the upper left corner of FIG. 14 represents the original abutment mark T of the original platen glass 102. An operator guidance is displayed on the display device 218 (see FIG. 10C) so that the operator can place the sheet S with a Bk patch side thereof oriented toward the original abutment mark T and with the front face thereof on the original platen glass 102. Thus, it is possible to prevent occurrence of control error due to wrong placing of the sheet S.

In the case of reading the patterns on the sheet S by the reader section 100A, scanning is started from the original abutment mark T, and the sheet S is progressively scanned until a first density gap point Q is obtained. This causes the CPU 214 of the reader section 100A to calculate the positions of the respective patches of the respective patterns as relative coordinates with respect to the coordinate point of the density gap point Q whereby the patterns are read.

In the case of reading a patch (designated by reference numeral 73 in FIG. 12), sixteen points within the patch, for example, are taken as reading points (each represented by a mark (x)), and signals obtained by reading the respective points are averaged. The number of the points is preferably optimized in the image processing apparatus.

<Generation and Configuration of LUT 25: Step S8>

Figure 19:
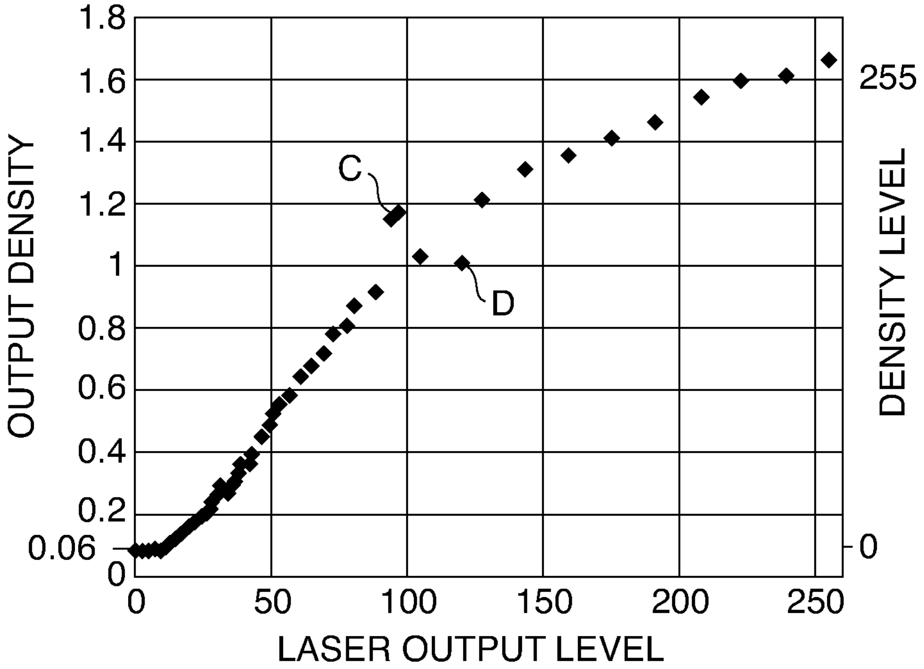
FIG. 19 is a diagram showing the relationship between the level of laser output and the density of an output image.

R, G, and B signal values each obtained by averaging the associated sixteen points are converted into respective density values by the above-described conversion method for obtaining the optical density values. FIG. 19 is a diagram showing the density values, with the left vertical axis representing the output density, the right vertical axis representing the density level, and the horizontal axis representing the laser output level. As shown by the right vertical axis, the base density (0.08 in the present example) of a sheet is normalized to a density level of 0, and the maximum density target value 1.60 is normalized to a density level of 255.

When obtained data includes an exceptionally high-density point, such as a point C, or an exceptionally low-density point, such as a point D, as shown in FIG. 19, there can be dirt on the original platen glass 102, or the test pattern can have defects thereon. To cope with such a problem, correction is performed by applying a limiter to the inclination of a characteristics curve in FIG. 19 such that the continuity of a data row is maintained. Specifically, when the inclination becomes not smaller than 3 at any of the above points, the inclination is fixedly set to 3, whereas when the inclination assumes a minus value, the density level is maintained at the same level as that of the immediately preceding point in FIG. 19.

The contents of the LUT 25 can be easily generated by replacing the axes of the coordinate system such that the density level in FIG. 19 is replaced by the input level (along the density signal axis in FIG. 6), and the laser output level in FIG. 19 by the output level (along the laser output signal axis in FIG. 6). The values of density levels which do not correspond to any patch are calculated by interpolation. In this case, a limiting condition is set such that when the input level is equal to 0, the output level is also equal to 0. Then, the prepared contents of the table for conversion are stored in the LUT 25.

Thus, contrast potential control by the first control for stabilization of the image reproducing characteristics of the system including both the reader section 100A and the printer section 100B and generation of the LUT 25 (γ conversion table) are completed. The CPU 214 of the reader section 100A displays a screen illustrated in FIG. 10D during execution of the above-described process, and displays a screen illustrated in FIG. 10E upon completion of the process.

In the first control (automatic gradation correction control), the output signal from the laser driver 27 is controlled so as to associate an image signal input to the image forming apparatus with an image to be finally recorded on a sheet. More specifically, the output signal from the laser driver 27 associated with the image signal is controlled so as to make the gradation of the image signal equal to that of the image to be finally recorded on the sheet. This ensures very accurate control to make it possible to obtain an output image with high gradation accuracy. However, in the first control, the operator has to manually perform an operation for reading a test print sheet, which makes frequent execution of the first control difficult.

To solve this problem, according to the present embodiment, a second control, described hereinbelow, is executed a plurality of times between cycles of the first control so as to prolong the stabilized state of the image reproducing characteristics.

Next, a detailed description will be given of the second control to be executed for prolonging the stabilized state of the image reproducing characteristics achieved by the first control.

Figure 21:
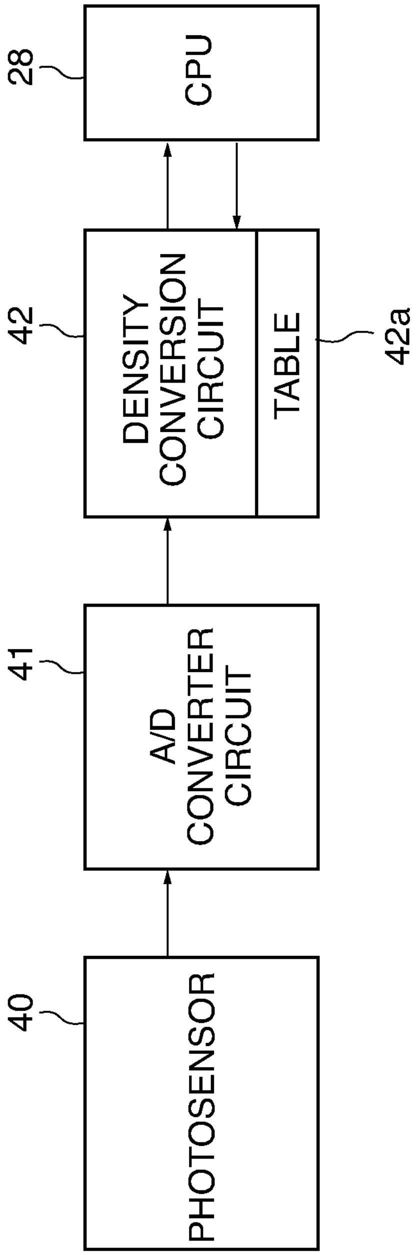
FIG. 21 is a block diagram of a signal processing system for processing an output signal from a photosensor comprised of an LED and a photodiode.

FIG. 21 is a block diagram of a signal processing system for processing output signals from the photosensor 40 comprised of the LED 10 and the photodiode 11.

As shown in FIG. 21, near infrared light that is reflected by the photosensitive drum 4 and enters the photosensor 40 is converted into an electric signal by the photosensor 40. The electric signal (having an output voltage e.g. of 0 to 5 V) is converted into a digital signal in a range of level 0 to 255. The digital signal is converted into a toner image density of toner on the photosensitive drum 4 by the density conversion circuit 42. The density conversion circuit 42 has a density conversion table 42*a* for converting an output signal from the photosensor 40 into a toner image density.

Figure 22:
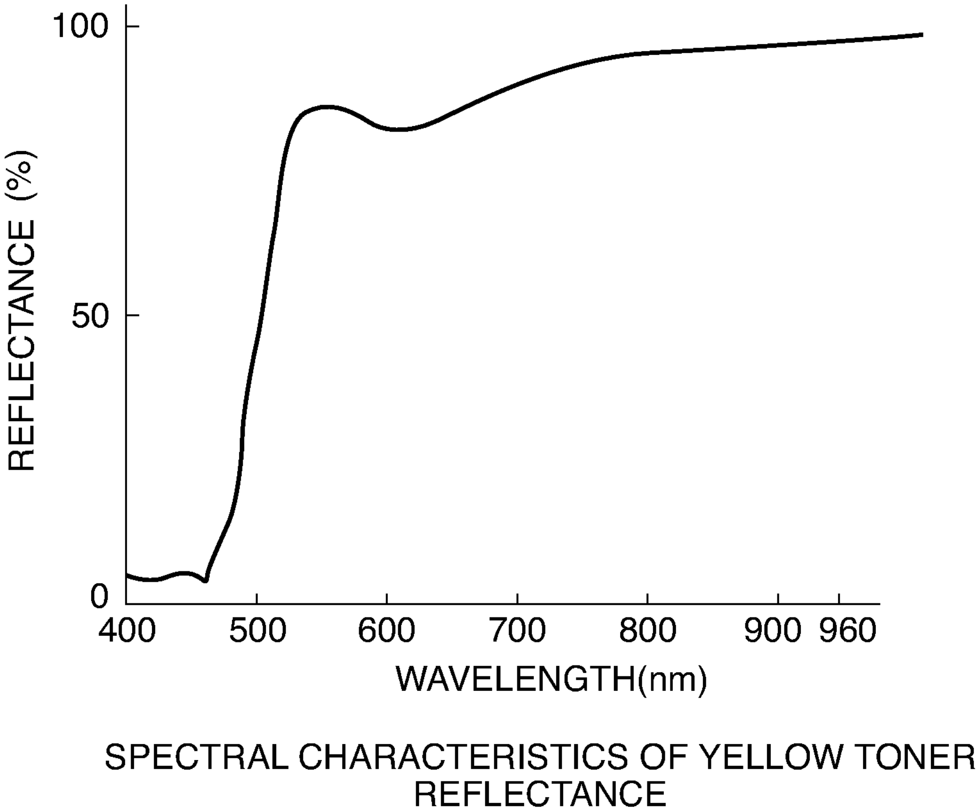
FIG. 22 is a diagram showing the spectral characteristics of yellow toner.
Figure 23:
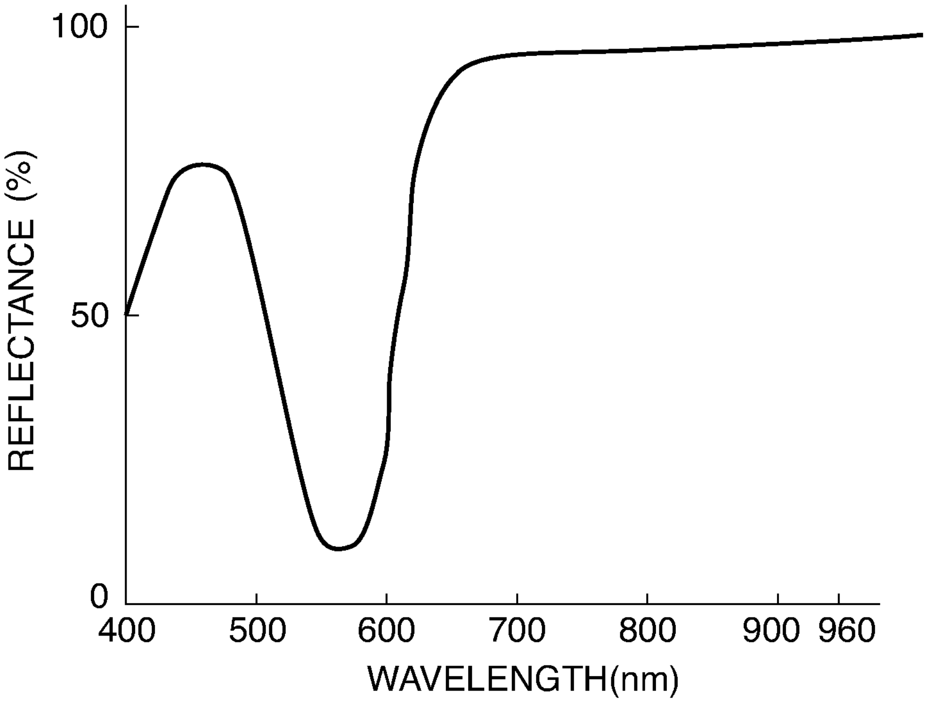
FIG. 23 is a diagram showing the spectral characteristics of magenta toner.
Figure 24:
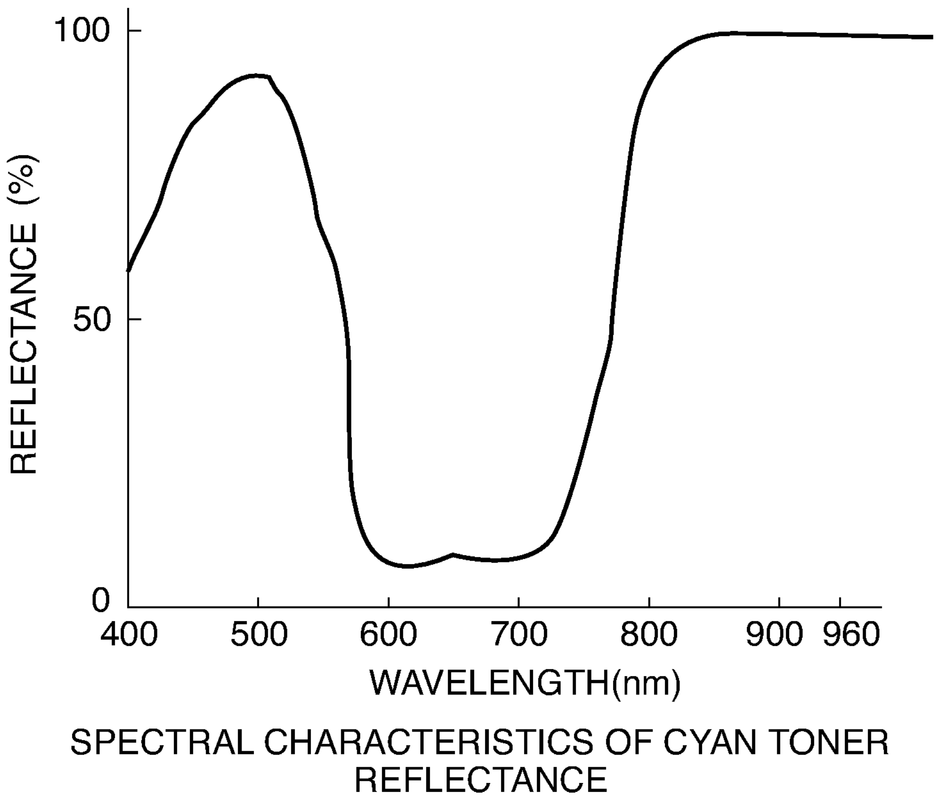
FIG. 24 is a diagram showing the spectral characteristics of cyan toner.
Figure 25:
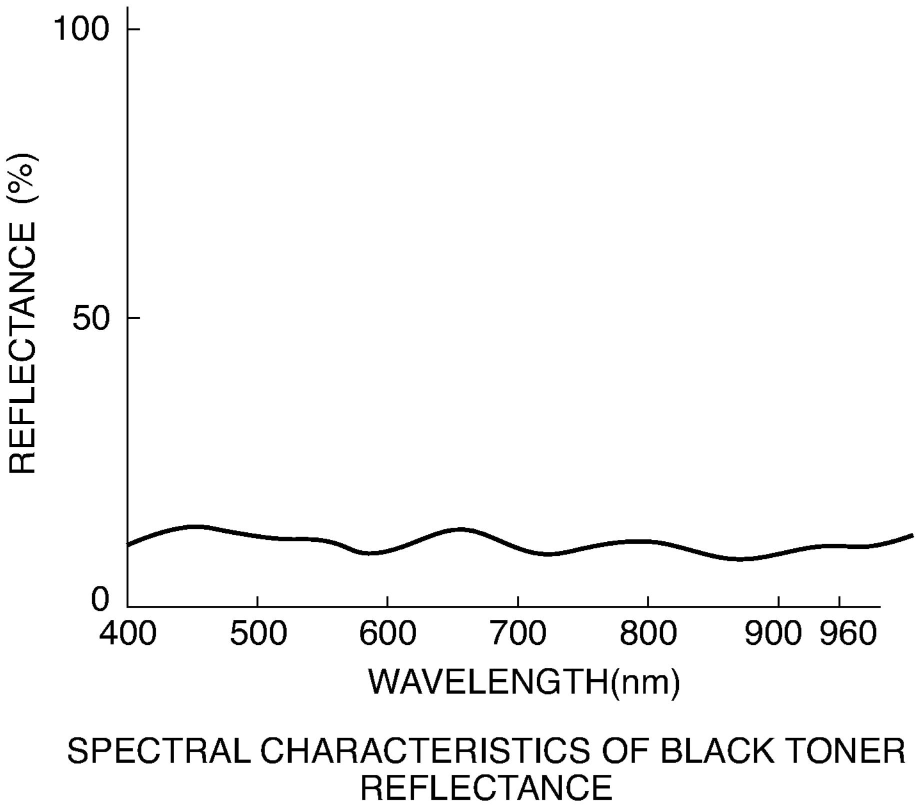
FIG. 25 is a diagram showing the spectral characteristics of black toner.

It should be noted that in the present embodiment, color toners of Y, M, and C are used, and each of the color toners is formed by dispersing a coloring material for an associated color into a binder made of a styrene-based copolymer resin. According to the spectral characteristics of the respective Y, M, and C color toners, the reflectance of each of the color toners to near infrared light (960 nm) is 80% or more, as shown in FIGS. 22 to 24. Further, in the image formation using the color toners, the two-component developing method is employed which is advantageous in color purity and transmittance. As for Bk toner, carbon black is used as a coloring material though the image formation using the Bk toner is also performed by the two-component developing method. For this reason, according to the spectral characteristics of Bk toner, the reflectance of Bk toner to near infrared light (960 nm) is approximately 10% as shown in FIG. 25.

Figure 26:
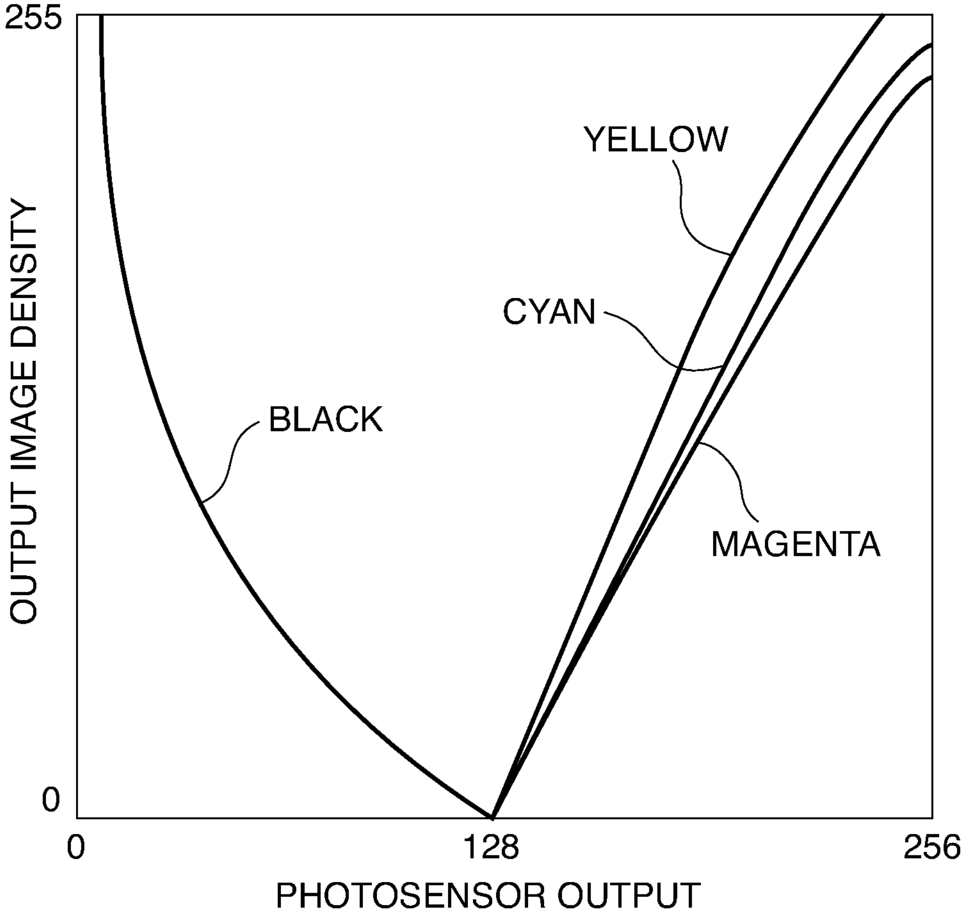
FIG. 26 is a diagram showing the relationship between the output from the photosensor and the output image density.

The photosensitive drum 4 is implemented by an OPC drum, and its reflectance to near infrared light (960 nm) is approximately 40%. The photosensitive drum 4 may be implemented by an amorphous silicon-based photosensitive drum or the like in place of the OPC drum insofar as the reflectance is approximately the same. FIG. 26 shows the relationship between the output from the photosensor 40 and the output image density in a case where toner image density on the photosensitive drum is changed stepwise by the area gradation of each color.

The output from the photosensor 40 in a state where no toner is stuck to the photosensitive drum 4 is set to 2.5 V, i.e. level 128. As is apparent from FIG. 26, as the area coverage ratio of each of Y, M, and C toners becomes higher to increase the image density, the output from the photosensor 40 becomes larger in a toner-sticking state of the photosensitive drum 4 than in the non-toner-sticking state. On the other hand, as the area coverage ratio of Bk toner becomes larger to increase the image density, the output from the photosensor 40 becomes smaller in the toner-sticking state of the photosensitive drum 4 than in the non-toner-sticking state.

Since the density conversion table 42*a* for converting a color-specific output signal from the photosensor 40 into a toner image density on the photosensitive drum 4 is generated using the characteristics shown in FIG. 26, it is possible to obtain the color-specific toner image density with high accuracy. It can be considered that the toner image density corresponds to a final image density on a sheet.

Therefore, in the second control, a change in characteristics of the image processing apparatus is estimated from a change in toner image density occurring with the input of the same image signal, and based on the estimated change, correction is performed such that the output image density is caused to linearly correspond to the image signal. The second control provides a reference density value setting function and a LUT correcting function, as described hereinbelow.

Figure 27:
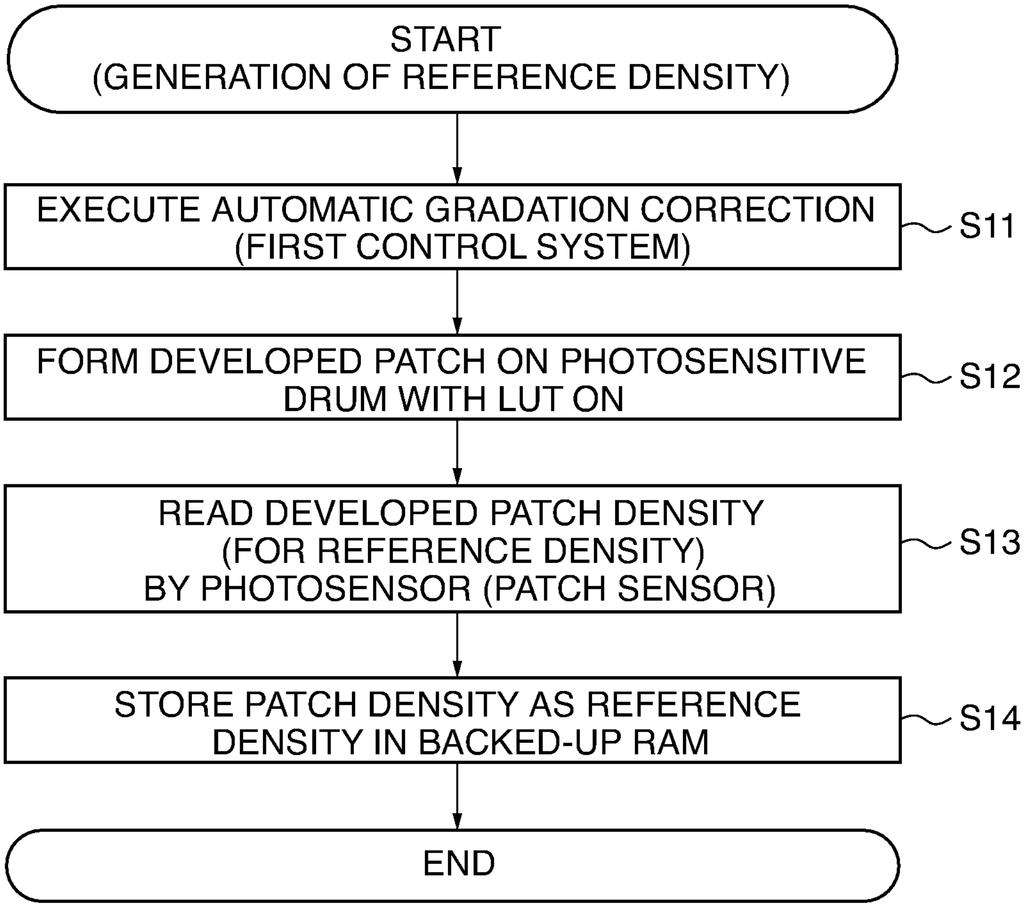
FIG. 27 is a flowchart of a reference density value-setting control process included in a second control.

FIG. 27 is a flowchart of a reference density value-setting control process included in the second control. The present process is executed based on a program by the CPU 28 of the printer section 100B.

As shown in FIG. 27, the CPU 28 of the printer section 100B confirms that the LUT generated by the first control (automatic gradation correction control) process has been set (updated) (step S11), and then performs the following processing: The CPU 28 causes patch patterns for the respective colors Y, M, C, and Bk to be formed and developed on the photosensitive drum and thereby cause developed patches to be formed (step S12). Then, the CPU 28 causes the density (for use as a reference density) of each developed patch to be detected by the photosensitive sensor 40 to read the density (step S13). The CPU 28 stores the densities of the respective developed patches as reference densities in the backed-up RAM 32.

The output signals to be output from the laser driver 27 so as to form the patch pattern on the photosensitive drum are set to respective values corresponding, respectively, to density signal (image signal) levels (Y: level 96, M: level 80, C: level 24, Bk: level 8). The set values of the respective density levels are configured to reproduce pale peach color in the image processing apparatus. The set values of the respective density levels can be changed on a color-by-color basis.

Figure 29:
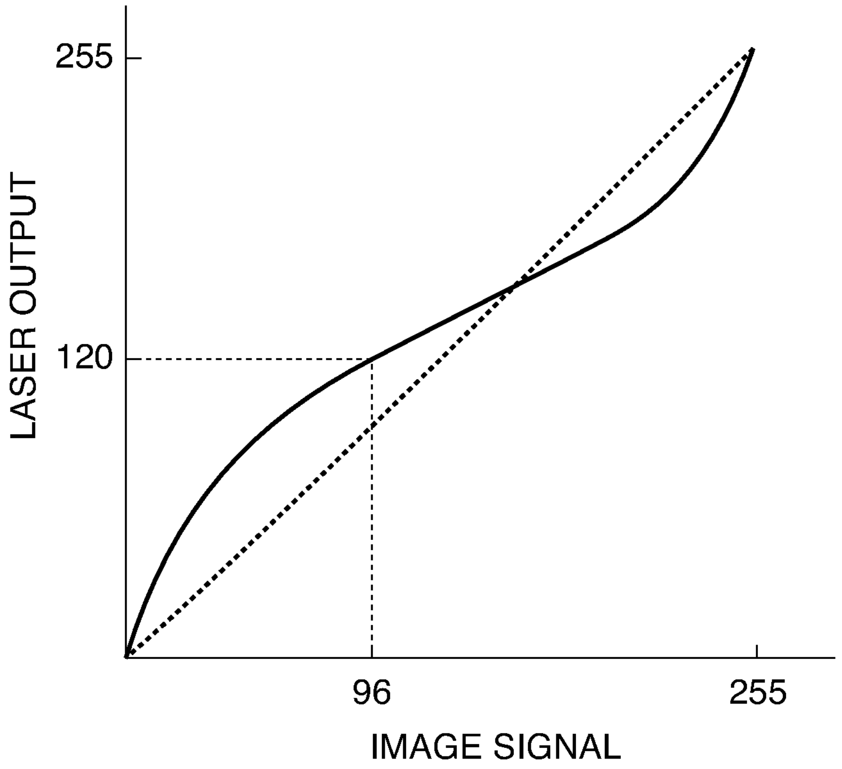
FIG. 29 is a diagram showing the relationship between image signal levels and the laser output levels.

Therefore, the color-specific output signals from the laser driver 27 are determined based on the LUT generated by the first control. For example, according to the Y-associated LUT shown in FIG. 29, the output signal from the laser driver 27 is set to level 120. In FIG. 29, the level 120 of the output signal from the laser driver 27 corresponds to the level 96 of the image signal. The LUT is set for each of the colors Y, M, C, and Bk, so that the output signals are set on a color-by-color basis. The following description will be given as to the LUT for the color Y, The output signal from the laser driver 27 is continuously set, i.e. not changed until the LUT is updated again by the first control, and therefore it is not an output value based on a LUT, described hereinafter, which is determined by the second control. The density value of a toner image on the photosensitive drum, which is determined by the density conversion table 42*a*, cannot be treated as the absolute density. This is because the resolution of a toner image on the photosensitive drum picked up by the photosensor 40 is inferior to that of an image picked up by the CCD sensor 105 of the reader section 100A, and the toner image on the photosensitive drum is different from a final image fixed on a sheet. However, it can be considered that the amount of change in density of the toner image on the photosensitive drum corresponds to that of change in the final image density.

For this reason, the density value obtained by the second control immediately after execution of the first control, more specifically, the density of the toner image on the photosensitive drum obtained by the printer controller 109 when the 96-level image signal in FIG. 29 is input, is determined as a reference density value. Further, by executing the second control in predetermined timing, how the density value of the toner image on the photosensitive drum has changed from the associated reference density value is checked. Then, a correction table (see FIG. 32C) is generated based on the amount of change in the density value of the toner image on the photosensitive drum, and the generated correction table is combined with the LUT 25 obtained in the first control into a single table, for execution of γ correction.

In other words, since the LUT 25 generated in the first control ensures that output density properly correspond to the image signal immediately after the first control, developed patches are formed on the photosensitive drum by output from the laser driver 27 based on the LUT 25 generated in the first control. The printer controller 109 stores the density values of the respective developed patches on the photosensitive drum as the ensured reference density values, whereby calibration of the photosensor 40 is effected.

More specifically, in the printer controller 109, how the density value of each developed patch has changed is determined based on the associated reference density value obtained as above, and the LUT 25 is corrected such that the density value of each developed patch becomes equal to the associated reference density value. By thus executing the second control for performing correction by looking up the LUT 25, in predetermined timing, it is possible to accurately maintain proper image density characteristics against changes due to a long term use.

Next, the relationship between the first control and the second control will be described in more detail. The first control is executed as the automatic gradation correction control process for stabilization of the image reproducing characteristics, as described hereinabove. On the other hand, the second control is comprised of the reference density value-setting control process and the LUT correction control process, as described below.

Figure 30:
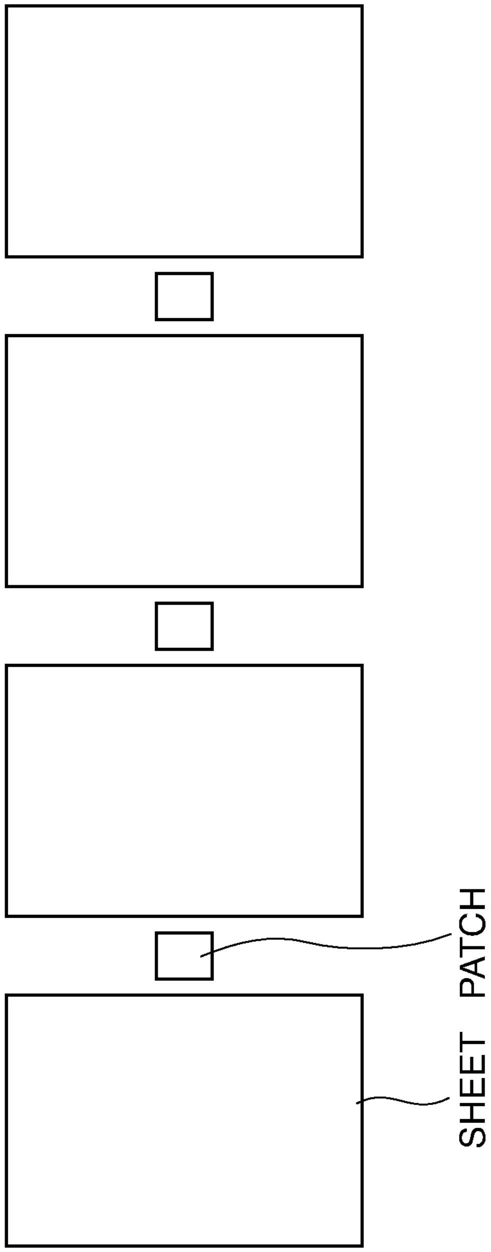
FIG. 30 is a view illustrating a manner in which a patch is formed between sheets.

As described hereinabove, after execution of the first control, a reference density value (indicated by A in FIG. 32) is determined by executing the reference density value-setting control process of the second control. Then, the LUT generated in the first control is corrected based on the difference between an density value (indicated by B in FIG. 32) obtained in the LUT correction control process of the second control and the reference density value. In general, the LUT correction control process is configured such that a patch forming operation is performed at intervals of image forming operation on a sheet (hereinafter referred to as "at sheet-to-sheet intervals"), as illustrated in FIG. 30 by way of example.

Figure 28:
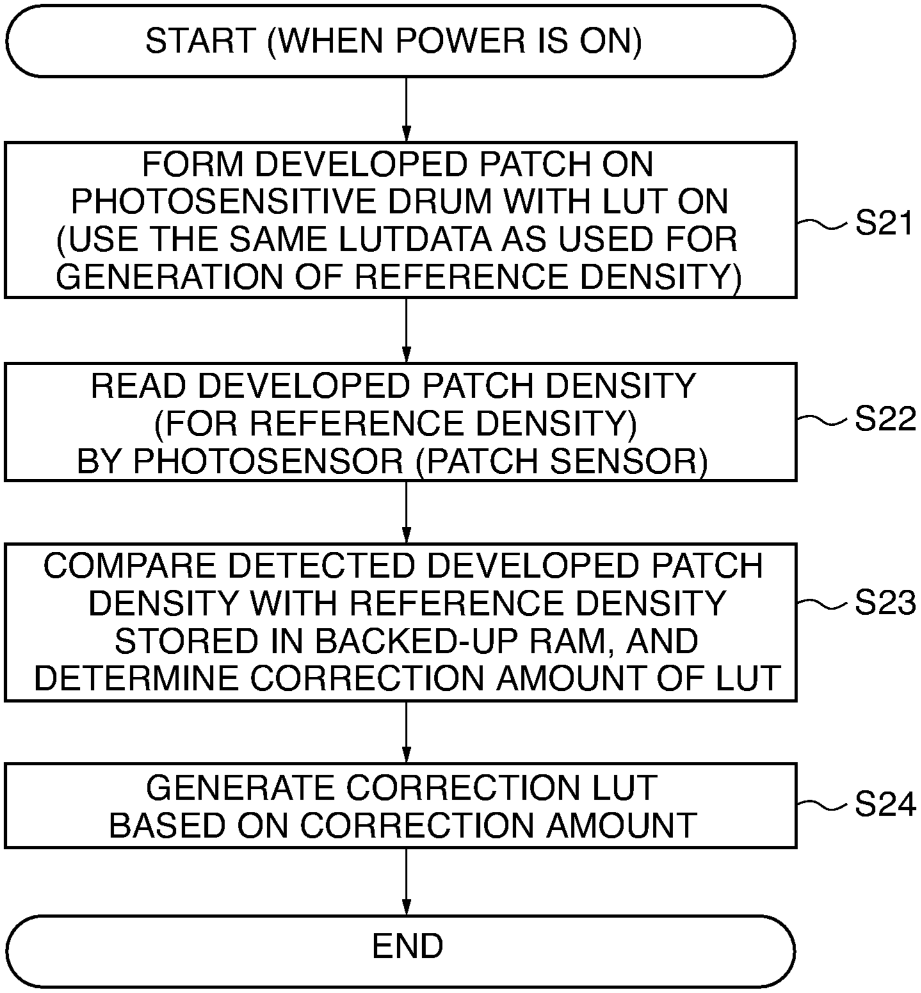
FIG. 28 is a flowchart of a LUT correction control process included in the second control process.

FIG. 28 is a flowchart of the LUT correction control process of the second control. The present process is executed based on a program by the CPU 28 of the printer section 100B.

As shown in FIG. 28, the CPU 28 of the printer section 100B causes developed patches to be formed on the photosensitive drum using data of the LUT 25 generated in the first control (i.e. the same data as obtained when the reference densities were determined) (step S21). Now, taking a Y image as an example, a developed patch for the Y image is formed on the photosensitive drum by an output from the laser driver 27 (determined by the LUT 25) corresponding to the level 96 of the image signal indicated in FIG. 29.

Next, the CPU 28 causes the photosensor 40 to detect the density of the developed patch to read the sensed density (step S22). Then, the CPU 28 compares the density of the developed patch with the associated reference density stored in the battery-backed up RAM 32 and determines the difference between the two values to thereby determine a LUT correction amount (step S23). Finally, the CPU 28 generates the correction LUT based on the correction amount (step S24).

Figure 31:
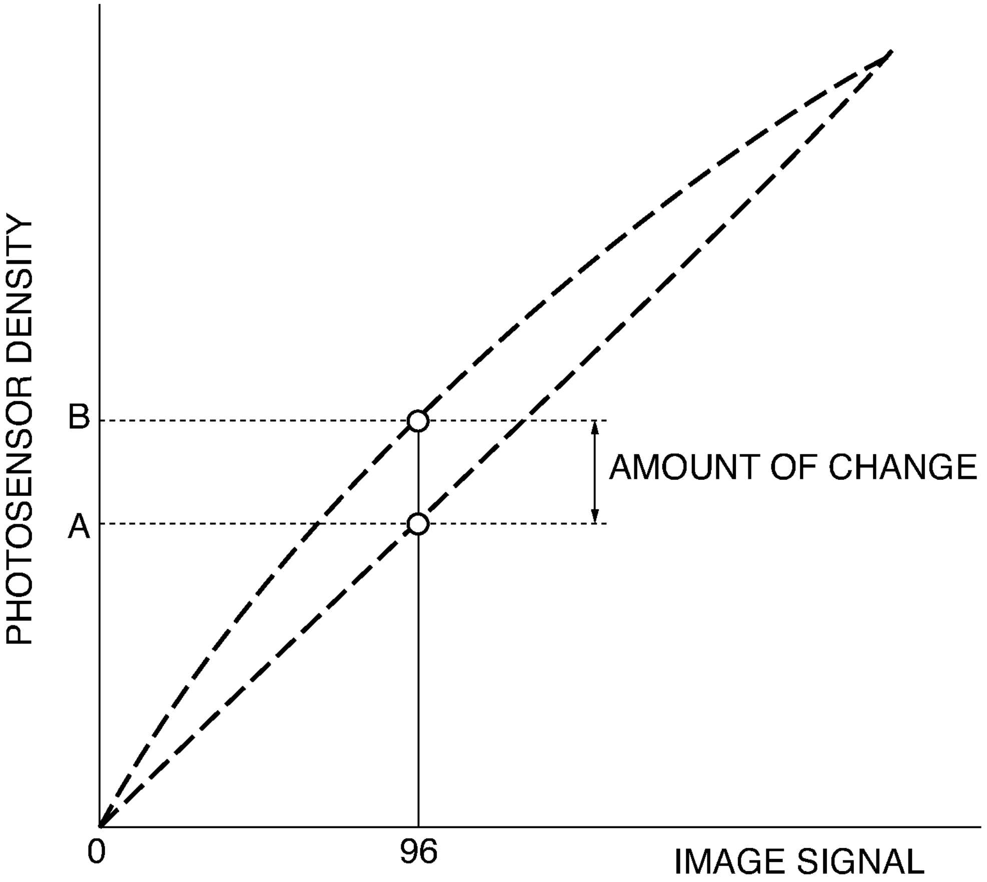
FIG. 31 is a diagram showing the amount of change in density detected by the photosensor when a developed patch is formed by input of the same image signal.

FIG. 31 is a diagram showing the amount of change in density detected by the photosensor 40 when a developed patch is formed by inputting the same image signal (level 96).

As shown in FIG. 31, assuming that the reference density value is at a level A and that the density of the developed patch detected by the photosensor 40 for correction when the main switch of the image processing apparatus is turned on is at a level B, the difference in density value represented by the vertical axis indicates the amount of change from the reference density.

Figure 32A:
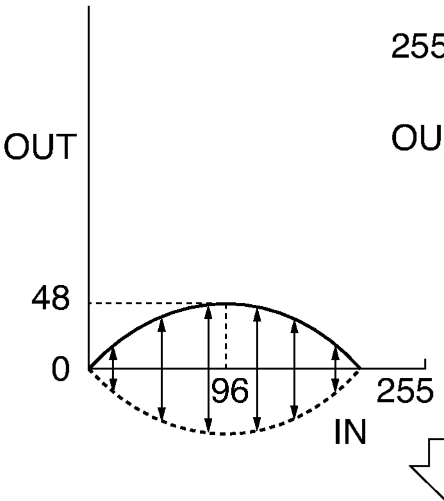
FIG. 32A is a diagram showing a correction characteristics table.
Figure 32B:
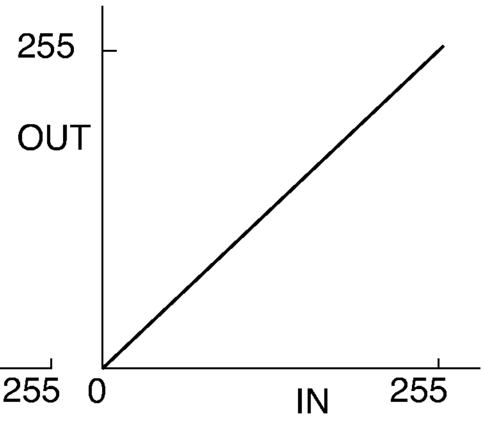
FIG. 32B is a diagram showing a linear table.

In the present embodiment, a correction characteristics table and a linear table are configured, respectively, as shown in FIGS. 32A and 32B.

Figure 32C:
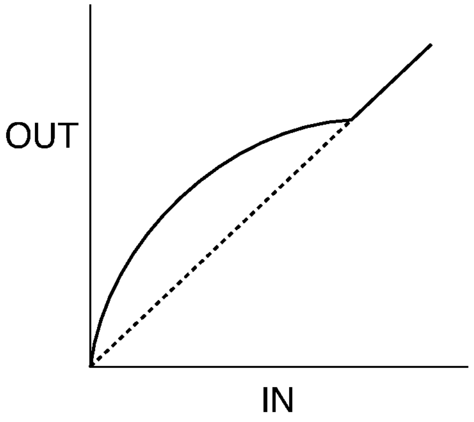
FIG. 32C is a diagram showing a correction table.

FIG. 32A is a diagram showing the correction characteristics table, FIG. 32B a diagram showing the linear table, and FIG. 32C a diagram showing a correction table.

FIG. 32A shows the correction characteristics table having correction characteristics based on basic characteristics of the present image processing apparatus. The correction characteristics table changes an output signal from the laser driver 27 in directions indicated by each double-headed arrow, according to the amount of change in density. In the present embodiment, the correction characteristics table is configured such that when the image signal is at the level 96, the correction characteristic shows a peak, and the output signal from the laser driver 27 reaches the level 48 at this time. A correction value (0 to 48) (vertical axis) with respect to the input image signal (horizontal axis) is determined using the correction characteristics table shown in FIG. 32A.

An actual correction amount K of the input image signal is calculated by the following equation:

$$K=(\text{correction value}(0\text{ to }48))\times[-(\text{amount of change in density})/\text{correction characteristic peak value}(48)]$$

Actual correction amounts of the input image signal corresponding to the respective 256 levels are calculated by the above equation, and the obtained values are added to the linear table (input signal=output signal) shown in FIG. 32B whereby the correction table shown in FIG. 32C is generated. In short, the correction characteristics table in FIG. 32A and the linear table in FIG. 32B are synthesized into the correction table in FIG. 32C. The correction table in FIG. 32C is provided so as to correct image signals to make the densities of respective patch images detected by the photosensor 40 equal to the associated reference densities, respectively.

For example, in a case where the input image signal is at level 48 and the amount of change in density is equal to 10, a vertical axis value with respect to a horizontal axis value of 48 is read from the correction characteristics table shown in FIG. 32A. Now, assuming that the vertical axis value is equal to 40, a value of 40×[−10/48]−8.3 is obtained from the above equation. Therefore, the correction table in FIG. 32C provides a value of 48−8.3=39.7=approximately 40. It should be noted that the correction characteristics table in FIG. 32A can be configured, as desired, according to the specification of an image processing apparatus.

The CPU 28 of the printer controller 109 combines the correction table in FIG. 32C generated in the second control such that an output of 40 corresponds to an input of 48, and the LUT 25 generated in the first control into a single table, and performs image formation using the table.

Figures 33A, 33B:
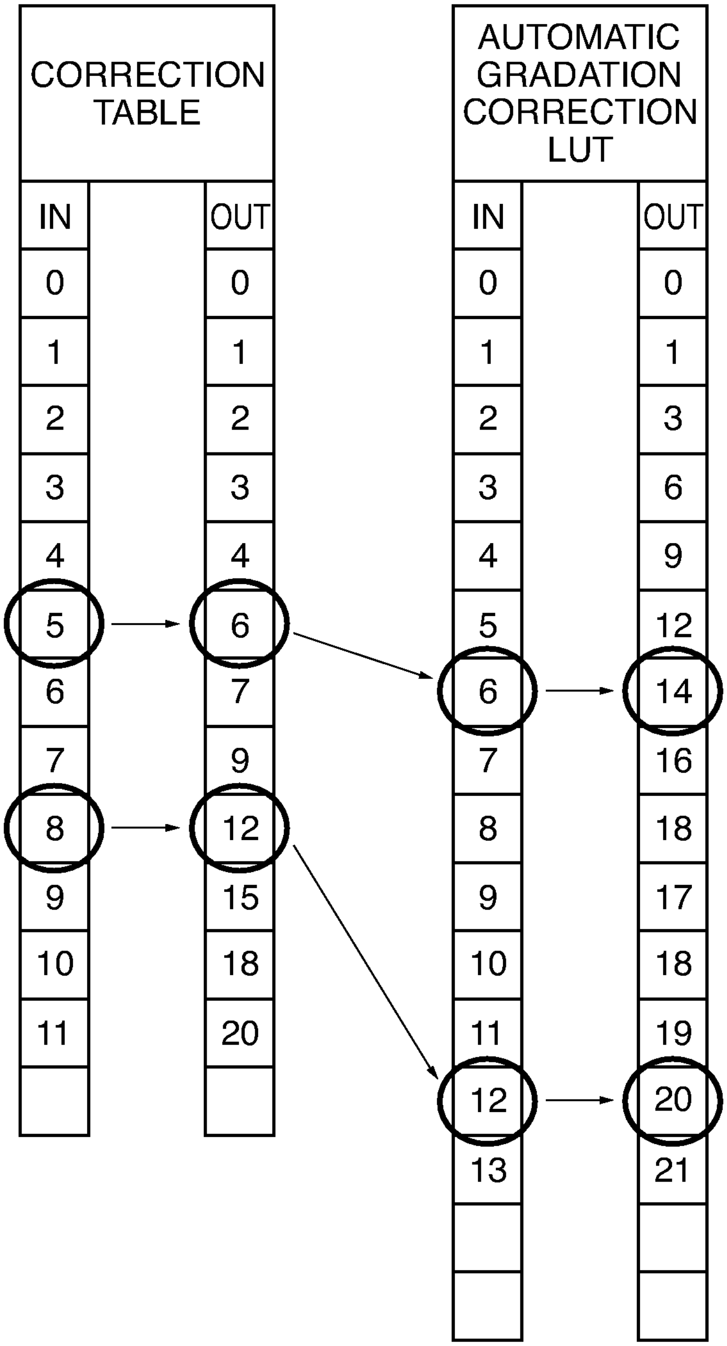
FIG. 33A is a diagram showing a correction table.
FIG. 33B is a diagram showing an automatic gradation correction LUT.

FIG. 33A is a diagram showing the correction table, and FIG. 33B is a diagram showing the automatic gradation correction LUT (LUT 25).

The printer controller 109 forms the single table by combining the correction table in FIG. 33A generated in the second control and the LUT 25 in FIG. 33B generated in the first control such that the combined table gives results obtained by first looking up the correction table in FIG. 33A and then looking up the LUT 25 in FIG. 33B according to the output from the correction table, and cause the printer engine 120 to perform an actual image formation using the combined table. The printer controller 109 stores the LUT 25 generated in the first control in a different storage area from a storage area where the correction table and the combined table are stored, and refers to the LUT 25 whenever the second control for correction is repeatedly executed. Thus, initial gradation characteristics can be maintained.

The first control requires manual operations such as operations on the operating section 217 and an operation for placing a sheet on the original platen glass 102, and hence it is supposedly difficult to execute the first control frequently. Therefore, a service person executes the first control when an image forming apparatus is installed, and then executes the second control insofar as no problem occurs with images formed based on the first control. In the second control, the gradation characteristics are automatically maintained at relatively short time intervals, while in the first control, when gradation characteristics have progressively undergone a change due to long-term use of the image processing apparatus, the gradation characteristics are calibrated so as to cope with such a change. This makes it possible to maintain the gradation characteristics until the service life of the image processing apparatus expires.

As described above, according to the present embodiment, after execution of the first control (automatic gradation correction control) process, the reference density value-setting control process of the second control is executed based on the LUT generated in the first control, whereby developed patches on the photosensitive drum are read in. The density of each of the read-in developed patches is stored as a reference density for use when an associated toner image density on the photosensitive drum is detected by the photosensor 40. The LUT generated in the first control is corrected according to the difference (amount of change) between the density value of a developed patch obtained by the second control for correction, which is executed after the first control, and the reference density associated therewith. Thus, image density characteristics obtained by the first control can be maintained over a long term.

Further, in the present embodiment, it is possible to achieve color stability more desirable in terms of visual characteristics by setting the density levels of the developed patches for the respective colors Y, M, C, and Bk in a manner each optimized to reproduce a memory color (sky blue, pale peach color, or the like).

Although in the present embodiment, the correction characteristics of the correction characteristics table are set to values that can correspond to either of the positive and negative sides of the amount of change in density in the table shown in FIG. 32A, this is not limitative, but it is also possible to use correction characteristics corresponding to the positive and negative sides of the amount of change in density, respectively, so as to further optimize the correction characteristics. Further, it is possible to obtain the same advantageous effects by providing a plurality of correction LUTs having respective types of correction characteristics and selecting one of correction LUTs for use according to the amount of change in density.

Further, in the present embodiment, a laser is used to form a latent image on the photosensitive drum, but this is not limitative. The present invention can also be applied to a case where an image is formed on a photosensitive drum using an exposure device, such as an LED, other than the laser.

Furthermore, in the present embodiment, values to be controlled are set for all the developed patches, respectively, but this is not limitative either. For example, in a case where sky blue is designated, when the output values of the respective component colors (Y, M, C, and Bk) are set to 0 or a lower density level (e.g. an image density of 0.1 or lower) which hardly contributes to color change, the default values of the printer engine or values set in an immediately preceding loop may be used without setting the output values of the respective component colors. This makes it possible to maintain a standard state without performing control at unnecessary patch levels.

As for the memory color (pale peach color) used in the above-described embodiment, it is possible to use a default value (e.g. level 48) of the printer engine without using the level 8 of Bk. Alternatively, it is possible to use the level 16 as a minimum printer engine set value corresponding to the image density of 0.1. Further, it is also possible to use an immediately preceding set value. In short, when the density level of a patch image of a designated target color is not higher than a predetermined value, one of the default value of the printer engine, the minimum printer engine set value, and the immediately preceding set value can be used.

As described above, according to the present embodiment, after execution of the first control, a reference density value is determined by the reference density value-setting control process of the second control, and a LUT generated in the first control is corrected based on a difference between a density value obtained by the second control for correction and the reference density value. This makes it possible to correct the image density of a target color on a real-time basis, thereby stably maintaining high-accuracy image density characteristics over a long term.

A second embodiment of the present invention is distinguished from the above-described first embodiment by a point described below. The other elements in the present embodiment are identical to the corresponding ones in the first embodiment (FIGS. 1, 2, 4, and 5), and therefore description thereof is omitted.

In the present embodiment, a description will be given of a case where a color to be stabilized (adjusted) in the image processing apparatus is designated as desired. The present embodiment is different from the first embodiment in that there are provided a module (function) for designating a color and a module (function) for color-separating the designated color into the colors Y, M, C, Bk and then setting patch density levels.

When there is a color which an operator desires to stabilize, the operator causes the reader section 100A of the image processing apparatus to read an image of an original including the color for adjustment. As the image of the original including the color to be adjusted, it is possible to envisage a natural picture, such as a photograph, and a color patch image, but it is not limited to a specific image. The CPU 214 causes the image read from the original by the reader section 100A to be displayed as a preview image on the screen of the display device 218. The operator touches a portion of the color for adjustment in the preview image on the screen, to thereby designate the color.

The designated color (target color) is masked by the masking UCR circuit 208 as in general color separation, and the density levels of the respective colors Y, M, C, and Bk are calculated. The calculated density levels are set as density levels of respective developed patches to be formed on the photosensitive drum 4, and the second control is executed in desired timing. The other control methods including a feedback control method are the same as those in the first embodiment.

Since the present embodiment is configured such that a color to be stabilized (adjusted) can be designated on the screen of the display device 218 of the reader section 100A, it is possible to satisfy an operator who desires further stabilization of the designated color.

Although in the present embodiment, a color to be stabilized is designated in the reader section 100A of the image processing apparatus, this is not limitative. The same advantageous effect can also be obtained in a case where a color to be stabilized is designated on the monitor of a personal computer (PC) which is capable of communicating with the image processing apparatus, and data of the designated color is transmitted from the PC to the image processing apparatus.

Further, in the present embodiment, in consideration of an operator who has an excellent color-setting capability and is capable of determining settings for the respective colors Y, M, C, and Bk by himself/herself, it is possible to provide a direct setting mode in which such an operator can directly configure the settings. It is to be understood that color setting may be performed not only by an operator, but also by a service person.

A third embodiment of the present invention is distinguished from the above-described first embodiment by a point described below. The other elements in the present embodiment are identical to the corresponding ones in the first embodiment (FIGS. 1, 2, 4, and 5), and therefore description thereof is omitted.

A description will be given of a case where two or more colors are designated as colors to be stabilized in the image processing apparatus. In the following, a case of designating two colors (first and second colors) will be taken as an example.

Now, it is assumed that the first color is formed by a Y color Y1 set to level 96, an M color M1 set to level 80, a C color C1 set to level 24, and a Bk color Bk1 set to level 8. Further, it is assumed that the second color is formed by a Y color Y2 set to level 128, an M color M2 set to level 64, a C color C2 set to level 48, and a Bk color Bk2 set to level 24.

First, the level values associated with the first color and the second color are compared with a set value of the minimum level for averaging, whereby it is checked whether or not each of the respective levels of the color components is within a range for averaging processing. Assuming that the set value of the minimum level is level 16, Bk1 of level 8 is below the set value, and hence is omitted from values to be averaged. More specifically, a Y set value, an M set value, and a C set value are determined as follows:

$$Y \text{ set value}=(Y1+Y2)/2=(96+128)/2=112 \text{ (level)}$$

$$M \text{ set value}=(M1+M2)/2(80+64)/2=72 \text{ (level)}$$

$$C \text{ set value}=(C1+C2)/2=(24+48)/2=36 \text{ (level)}$$

As for Bk, since Bk1 is not used, a Bk set value is determined as follows:

$$Bk \text{ set value}=(Bk2)/1=24/1=24\text{(level)}$$

Then, the Y, M, C, and Bk set values are set as density levels of the respective developed patches, and the second control is executed in desired timing. The other control methods including a feedback control method are the same as those in the first embodiment.

According to the present embodiment, even when two or more colors are designated as ones to be stabilized, since the density levels are averaged, it is possible to stabilize the designated colors.

Although in the present embodiment, a description was given of calculation performed when two colors are designated as colors to be stabilized, this is not limitative, but it is to be understood that the present invention can also be applied to a case where three or more colors are designated as colors to be stabilized.

Further, although in the present embodiment, the density levels of the respective color components are simply averaged, this is not limitative, but it is also possible to carry out calculation for obtaining a weighted average basically in a highlighted range (low-density range) where hue variation can be easily recognized in terms of visibility or calculation performed with an engine default value added for averaging operation in consideration of the default value of the printer engine. This makes it possible to suppress hue variation effectively.

A fourth embodiment of the present invention is distinguished from the above-described first embodiment by a point described below. The other elements in the present embodiment are identical to the corresponding ones in the first embodiment (FIGS. 1, 2, 4, and 5), and therefore description thereof is omitted.

In the present embodiment, even when a plurality of colors are designated as colors to be stabilized in the image processing apparatus, patches are formed on the photosensitive drum at the density levels of the respective patches without averaging the density levels. Hereafter, a description will be given of a case where LUTs are generated for the density levels of the respective patches, and the generated LUTs are synthesized. In the following description, a case where two colors are designated will be taken as an example.

A description will be given of a single color component, for simplicity of explanation. Now, it is assumed that in the two designated colors (target colors), a Y color Y1 is set to level 64, and a Y color Y2 is to level 128. A LUT generating method associated with a single patch level is similar to that in the first embodiment, and therefore description thereof is omitted.

Figure 34:
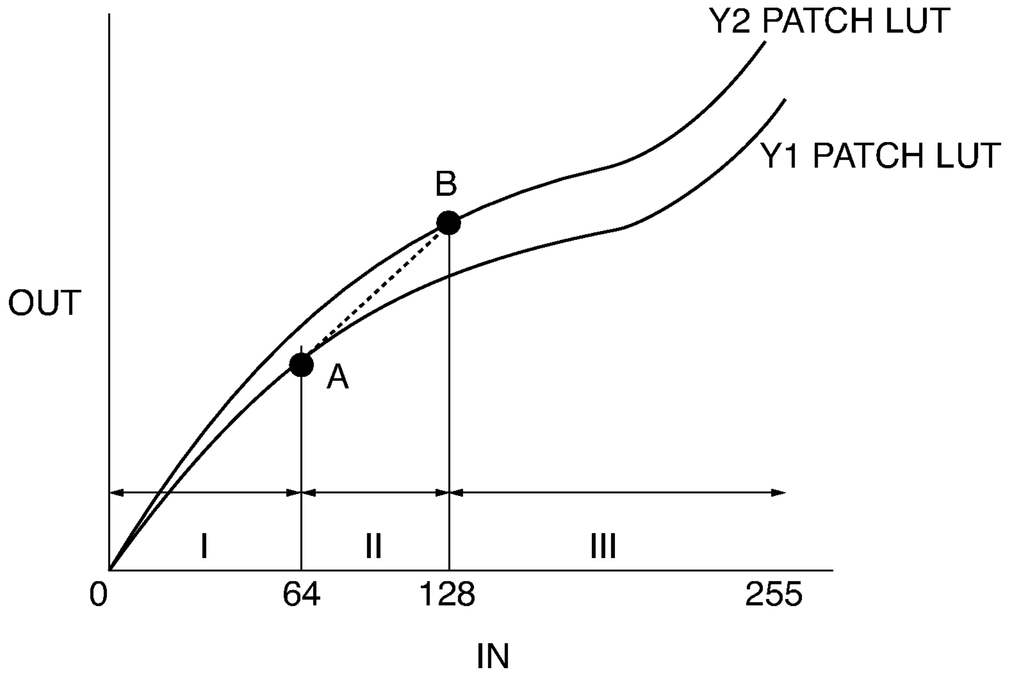
FIG. 34 is a diagram showing LUTs obtained by calculation by executing the second control process at respective patch levels in an image processing apparatus according to a fourth embodiment of the present invention.

FIG. 34 is a diagram showing LUTs obtained by calculation performed by execution of the second control at respective patch levels in an image processing apparatus according to the present embodiment.

In FIG. 34, it is assumed that an output value in the LUT associated with a Y1 patch level is A, and an output value in the LUT associated with a Y2 patch level is B. The LUT is roughly divided into a section II between a point A and a point B, a section I from 0 to 64 (point A), and a section III from 128 (point B) to 255. For LUT synthesis, a LUT generated at the Y1 patch level is used for the section I, and a LUT generated at the Y2 patch level is used for the section III. This is because higher accuracy can be obtained by using a LUT closer to a patch level at which the LUT is generated. The section II is synthesized by connecting between the two LUTs by linear-interpolation such that the point A and the point B are connected (see a broken line C).

In the present embodiment, the optimum LUTs are generated at the respective Y1 and Y2 patch levels as above, and then the two LUTs are synthesized into a single LUT. This makes it possible to cope with a plurality of patch levels while more reliably maintaining stability of designated colors than in the third embodiment in which a LUT is generated after averaging patch levels.

Although in the present embodiment, linear-interpolation is performed by connecting between the points A and B, this is not limitative. For example, the points A and B may be connected by an A-B characteristic curve generated by averaging LUT values between the points A and B, to thereby more smoothly synthesize the two LUT into a single one.

As described above, according to the first to fourth embodiments, it is possible to maintain highly accurate image density characteristics over a long term. Further, since the density levels of developed patches are set on a color-by-color basis, it is possible to realize more desirable color stability of memory colors and the like. Furthermore, since an operator designates a color to be stabilized and then the density level of a developed patch associated with the designated color is set, it is possible to achieve further stabilization of the color.

Although in the above-described embodiments, a patch is formed on the photosensitive drum of an image processing apparatus based on the method of transferring a toner image formed on the photosensitive drum onto a sheet, this is not limitative, but a patch may be formed on an intermediate transfer member of an image processing apparatus configured based on the method of primarily transferring a toner image formed on the photosensitive drum onto the intermediate transfer member, and then secondarily transferring the toner image on the intermediate transfer member onto a sheet.

It is to be understood that the relative arrangement of the component elements of the image processing apparatus, the numerical expressions and numerical values set forth in this embodiment do not limit the scope of the present invention unless it is specifically stated otherwise.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2006-318655 filed Nov. 27, 2006, and Japanese Patent Application No. 2007-302129 filed Nov. 21, 2007, which is hereby incorporated by reference herein in its entirety.

What is claimed is:

1. An image forming apparatus comprising:

an image forming unit configured to form an image on an image carrier based on an inputted image signal, and to transfer the image formed on the image carrier onto a sheet;

a first density detecting unit configured to detect a density of the image transferred onto the sheet;

a second density detecting unit configured to detect a density of the image formed on the image carrier;

a first control unit configured to cause said image forming unit to form a first image corresponding to a test image signal onto the sheet;

a generating unit configured to generate conversion data for converting the inputted image signal, based on the test image signal and the density of the first image detected by the first density detecting unit;

a second control unit configured to cause said image forming unit to form a second image on the image carrier;

a storing unit configured to store, as a reference density of the second image, a density of the second image detected by the second density detecting unit at a first timing;

a correcting unit configured to correct the conversion data based on (i) the reference density of the second image stored by the storing unit and (ii) a density of the second image detected by the second density detecting unit at a second timing after the first timing; and a designating unit configured to designate, manually, a density value, wherein the second control unit causes the image forming unit to form the second image on the image carrier based on the density value designated by the designating unit, and wherein, in a case where the density value, which is designated by the designating unit, is less than a predetermined value, the second control unit causes the image forming unit to form the second image based on another density value that is higher than the density value designated by the designating unit.

2. An image forming apparatus as claimed in claim 1, wherein the second image is formed between a plurality of images while said image forming unit forms the plurality of images at regular intervals.

3. An image forming apparatus as claimed in claim 1, further comprising:

a display unit configured to display an image for designating the density value, wherein the designating unit designates at least one position of the image displayed by the display unit, and wherein the second control unit causes the image forming unit to form the second image based on a density of a designated position that is designated by the designating unit.

4. An image forming apparatus as claimed in claim 3, wherein said first density detecting unit comprises a scanner that reads an original, and wherein the display unit displays a reading image that corresponds to the original read by the scanner in order to designate the at least one position.

5. An image forming apparatus as claimed in claim 1, wherein said second control unit causes said image forming unit to form the second image for every color component.

6. An image forming apparatus as claimed in claim 1, wherein the second control unit causes the image forming unit to form the second image based on the conversion data and the density value designated by the designating unit.

* * * * *